(12) United States Patent
Liang et al.

(10) Patent No.: US 9,768,090 B2
(45) Date of Patent: Sep. 19, 2017

(54) SUBSTRATE DESIGN FOR SEMICONDUCTOR PACKAGES AND METHOD OF FORMING SAME

(71) Applicant: Taiwan Semiconductor Manufacturing Company, Ltd., Hsin-Chu (TW)

(72) Inventors: Yu-Min Liang, Zhongli (TW); Mirng-Ji Lii, Sinpu Township (TW); Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/304,331

(22) Filed: Jun. 13, 2014

(65) Prior Publication Data
US 2015/0235915 A1   Aug. 20, 2015

Related U.S. Application Data

(63) Continuation-in-part of application No. 14/181,305, filed on Feb. 14, 2014.

(51) Int. Cl.
*H01L 23/13* (2006.01)
*H01L 23/14* (2006.01)
(Continued)

(52) U.S. Cl.
CPC .......... *H01L 23/145* (2013.01); *H01L 21/486* (2013.01); *H01L 21/4857* (2013.01);
(Continued)

(58) Field of Classification Search
CPC ... H01L 23/13; H01L 23/5389; H01L 25/105; H01L 21/4857; H01L 23/5385; H05K 1/186
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| JP | 2008103536 A | 5/2008 |
| JP | 4339309 B2 | 10/2009 |

(Continued)

OTHER PUBLICATIONS

Kurita et al., "SMAFTI Package Technology Features Wide-Band and Large-Capacity Memory", Innovative Common Technologies to Support State-of-the-Art Products, pp. 52-56.

(Continued)

*Primary Examiner* — Kenneth Parker
*Assistant Examiner* — Fang-Xing Jiang
(74) *Attorney, Agent, or Firm* — Slater Matsil, LLP

(57) ABSTRACT

An embodiment device package includes a package substrate and a first and a second die bonded to the package substrate. The package substrate includes a build-up portion comprising a first contact pad and a plurality of bump pads. The package substrate further includes an organic core attached to the build-up portion, a through-via electrically connected to the first contact pad and extending through the organic core, a second contact pad on the through-via, a connector on the second contact pad, and a cavity extending through the organic core. The cavity exposes the plurality of bump pads, and the first die is disposed on the cavity and is bonded to the plurality of bump pads.

17 Claims, 40 Drawing Sheets

(51) Int. Cl.
  *H01L 25/065* (2006.01)
  *H01L 23/00* (2006.01)
  *H01L 23/538* (2006.01)
  *H01L 21/48* (2006.01)
  *H01L 21/56* (2006.01)
  *H05K 3/46* (2006.01)
  *H05K 1/18* (2006.01)
  *H01L 23/367* (2006.01)
  *H01L 23/42* (2006.01)
  *H01L 23/498* (2006.01)
  *H01L 23/31* (2006.01)
  *H05K 1/02* (2006.01)
  *H05K 3/00* (2006.01)

(52) U.S. Cl.
  CPC ............ *H01L 21/561* (2013.01); *H01L 23/13* (2013.01); *H01L 23/5383* (2013.01); *H01L 23/5384* (2013.01); *H01L 23/5389* (2013.01); *H01L 24/17* (2013.01); *H01L 24/19* (2013.01); *H01L 24/81* (2013.01); *H01L 24/97* (2013.01); *H01L 25/0657* (2013.01); *H05K 1/182* (2013.01); *H05K 3/4697* (2013.01); *H01L 21/568* (2013.01); *H01L 23/3128* (2013.01); *H01L 23/367* (2013.01); *H01L 23/42* (2013.01); *H01L 23/49811* (2013.01); *H01L 23/49816* (2013.01); *H01L 2224/12105* (2013.01); *H01L 2224/131* (2013.01); *H01L 2224/13147* (2013.01); *H01L 2224/16227* (2013.01); *H01L 2224/32225* (2013.01); *H01L 2224/32245* (2013.01); *H01L 2224/73204* (2013.01); *H01L 2224/73253* (2013.01); *H01L 2224/73267* (2013.01); *H01L 2224/81005* (2013.01); *H01L 2224/81192* (2013.01); *H01L 2224/83005* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2924/12042* (2013.01); *H01L 2924/1533* (2013.01); *H01L 2924/15151* (2013.01); *H01L 2924/15153* (2013.01); *H01L 2924/15159* (2013.01); *H01L 2924/15311* (2013.01); *H01L 2924/15313* (2013.01); *H01L 2924/15331* (2013.01); *H01L 2924/16235* (2013.01); *H01L 2924/16251* (2013.01); *H01L 2924/181* (2013.01); *H01L 2924/18162* (2013.01); *H05K 1/0203* (2013.01); *H05K 3/007* (2013.01); *H05K 2201/066* (2013.01)

(56) References Cited

U.S. PATENT DOCUMENTS

| | | | |
|---|---|---|---|
| 5,075,253 A | 12/1991 | Sliwa, Jr. | |
| 5,380,681 A | 1/1995 | Hsu | |
| 5,481,133 A | 1/1996 | Hsu | |
| 5,818,404 A | 10/1998 | Lebby et al. | |
| 5,895,978 A | 4/1999 | Palagonia | |
| 6,002,177 A | 12/1999 | Gaynes et al. | |
| 6,025,648 A * | 2/2000 | Takahashi | H01L 25/105 257/685 |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,271,469 B1 | 8/2001 | Ma et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,603,072 B1 | 8/2003 | Foster et al. | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,791,195 B2 | 9/2004 | Urushima | |
| 6,879,510 B2 | 4/2005 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,098,542 B1 | 8/2006 | Hoang et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,217,994 B2 * | 5/2007 | Zhu | H01L 23/5385 257/686 |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,632,719 B2 | 12/2009 | Choi et al. | |
| 7,659,632 B2 | 2/2010 | Tsao et al. | |
| 7,834,450 B2 | 11/2010 | Kang | |
| 7,928,582 B2 | 4/2011 | Hutto | |
| 8,164,171 B2 | 4/2012 | Lin et al. | |
| 8,284,561 B2 * | 10/2012 | Su | H05K 1/186 174/260 |
| 8,361,842 B2 | 1/2013 | Yu et al. | |
| 8,519,537 B2 | 8/2013 | Jeng et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,796,846 B2 | 8/2014 | Lin et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,865,521 B2 | 10/2014 | Jeng et al. | |
| 8,877,554 B2 | 11/2014 | Tsai et al. | |
| 8,896,109 B2 | 11/2014 | Pagaila et al. | |
| 8,970,023 B2 | 3/2015 | Chou et al. | |
| 2002/0003232 A1 | 1/2002 | Ahn et al. | |
| 2002/0003297 A1 | 1/2002 | Smola et al. | |
| 2002/0081755 A1 | 6/2002 | Degani et al. | |
| 2003/0035270 A1 | 2/2003 | Shieh et al. | |
| 2004/0056344 A1 | 3/2004 | Ogawa et al. | |
| 2004/0245608 A1 | 12/2004 | Huang et al. | |
| 2006/0113653 A1 * | 6/2006 | Xiaoqi | H01L 23/5385 257/686 |
| 2006/0145328 A1 * | 7/2006 | Hsu | H01L 23/5389 257/690 |
| 2006/0249828 A1 | 11/2006 | Hong | |
| 2007/0289127 A1 * | 12/2007 | Hurwitz | H01L 21/4857 29/827 |

(56) References Cited

U.S. PATENT DOCUMENTS

| | | | |
|---|---|---|---|
| 2007/0290319 A1* | 12/2007 | Kim | H01L 23/13 257/686 |
| 2008/0116589 A1 | 5/2008 | Li et al. | |
| 2008/0185719 A1 | 8/2008 | Cablao et al. | |
| 2008/0248610 A1 | 10/2008 | Chew et al. | |
| 2008/0265434 A1 | 10/2008 | Kurita | |
| 2008/0272477 A1 | 11/2008 | Do et al. | |
| 2008/0283992 A1 | 11/2008 | Palaniappan et al. | |
| 2008/0315372 A1 | 12/2008 | Kuan et al. | |
| 2009/0065927 A1 | 3/2009 | Meyer | |
| 2009/0121326 A1 | 5/2009 | Kim et al. | |
| 2009/0186446 A1 | 7/2009 | Kwon et al. | |
| 2009/0230531 A1 | 9/2009 | Do et al. | |
| 2009/0243065 A1 | 10/2009 | Sugino et al. | |
| 2009/0309212 A1 | 12/2009 | Shim et al. | |
| 2009/0321921 A1* | 12/2009 | Hwang | H01L 23/13 257/701 |
| 2010/0019370 A1 | 1/2010 | Pressel et al. | |
| 2010/0052135 A1 | 3/2010 | Shim et al. | |
| 2010/0102428 A1 | 4/2010 | Lee et al. | |
| 2010/0244219 A1 | 9/2010 | Pagaila et al. | |
| 2010/0276787 A1 | 11/2010 | Yu et al. | |
| 2010/0314749 A1 | 12/2010 | Kurita | |
| 2011/0024888 A1 | 2/2011 | Pagaila et al. | |
| 2011/0210444 A1 | 9/2011 | Jeng et al. | |
| 2011/0241192 A1 | 10/2011 | Ding et al. | |
| 2011/0278732 A1 | 11/2011 | Yu et al. | |
| 2011/0285005 A1 | 11/2011 | Lin et al. | |
| 2011/0291288 A1 | 12/2011 | Wu et al. | |
| 2011/0304999 A1 | 12/2011 | Yu et al. | |
| 2012/0049352 A1 | 3/2012 | Kang et al. | |
| 2012/0286407 A1 | 11/2012 | Choi et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0075903 A1 | 3/2013 | Pagaila et al. | |
| 2013/0082364 A1 | 4/2013 | Wang et al. | |
| 2013/0119533 A1 | 5/2013 | Chen et al. | |
| 2013/0168848 A1 | 7/2013 | Lin et al. | |
| 2013/0214426 A1 | 8/2013 | Zhao et al. | |
| 2013/0252378 A1 | 9/2013 | Jeng et al. | |
| 2013/0307140 A1 | 11/2013 | Huang et al. | |
| 2014/0203429 A1 | 7/2014 | Yu et al. | |
| 2014/0217610 A1 | 8/2014 | Jeng et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2014/0353823 A1 | 12/2014 | Park et al. | |
| 2015/0235993 A1 | 8/2015 | Cheng et al. | |
| 2016/0240508 A1 | 8/2016 | Hou et al. | |

FOREIGN PATENT DOCUMENTS

| | | |
|---|---|---|
| KR | 20090028687 A | 3/2009 |
| KR | 20090122277 A | 11/2009 |
| KR | 20100119507 A | 11/2010 |
| KR | 20120019091 A | 3/2012 |
| KR | 20130077031 A | 7/2013 |

OTHER PUBLICATIONS

Motohashi et al., "SMAFTI Package with Planarized Multilayer Interconnects", IEEE, Electronic Components and Technology Conference, 2009, pp. 599-606.

Kurita et al., "SMAFTI Packaging Technology for New Interconnect Hierarchy", IEEE, NEC Electronics Corporation Sagamihara, Kanagawa, 229-1198, Japan, 2009, pp. 220-222.

Ranganathan, N., et al., "Integration of High Aspect Ratio Tapered Silicon Via for Through-Silicon Interconnection" 58th Electronic Components and Technology Conference, ECTC 2008., May 2008, pp. 859-865, IEEE, Lake Buena Vista, Florida, United States.

* cited by examiner

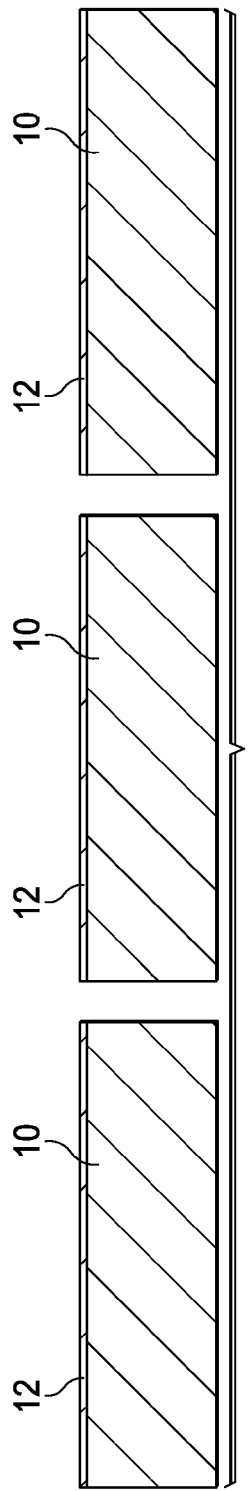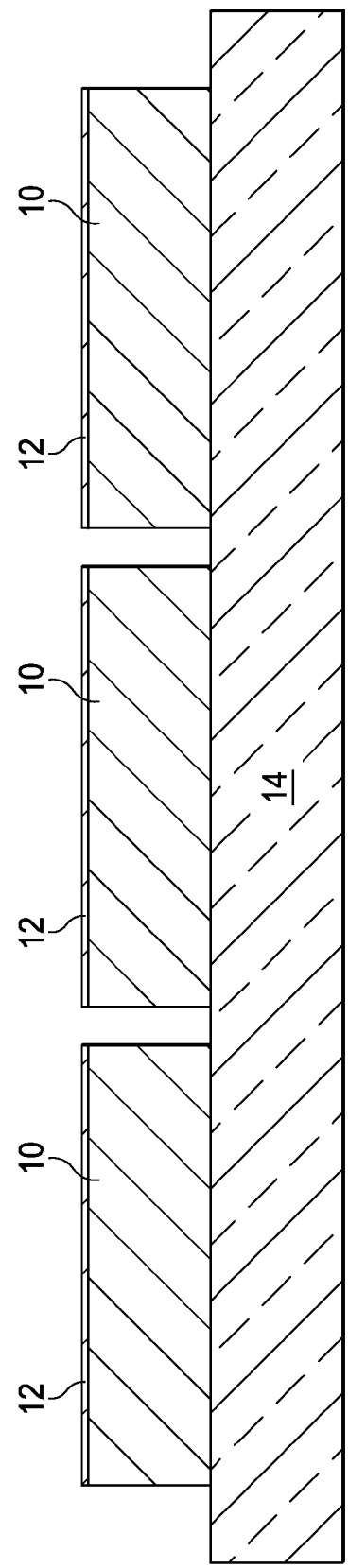

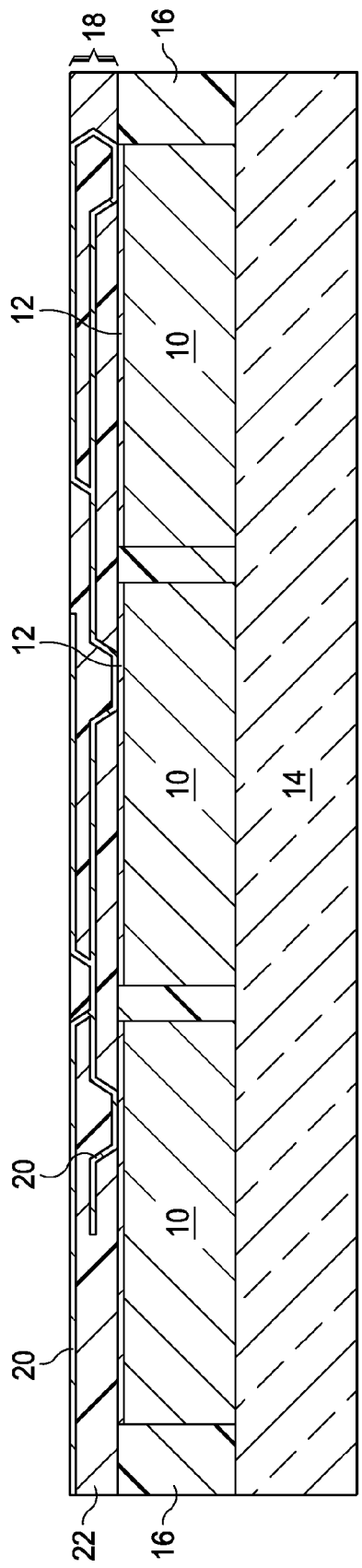
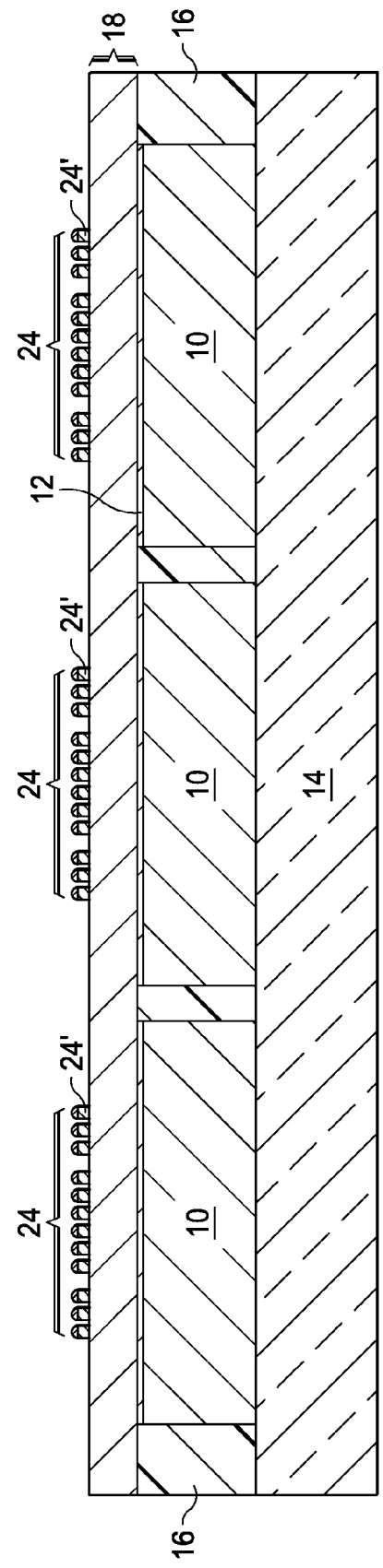
FIG. 1E
FIG. 1F

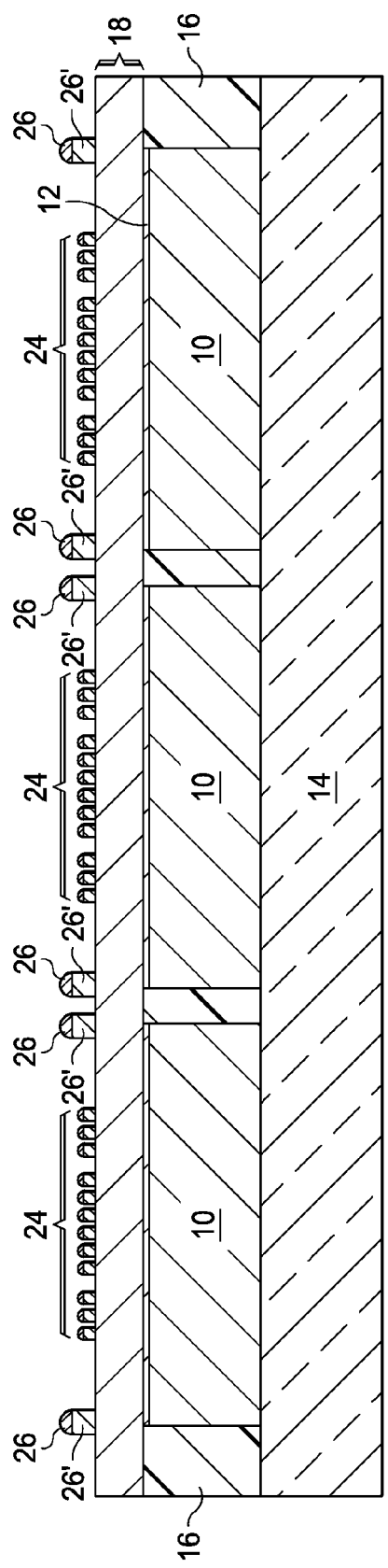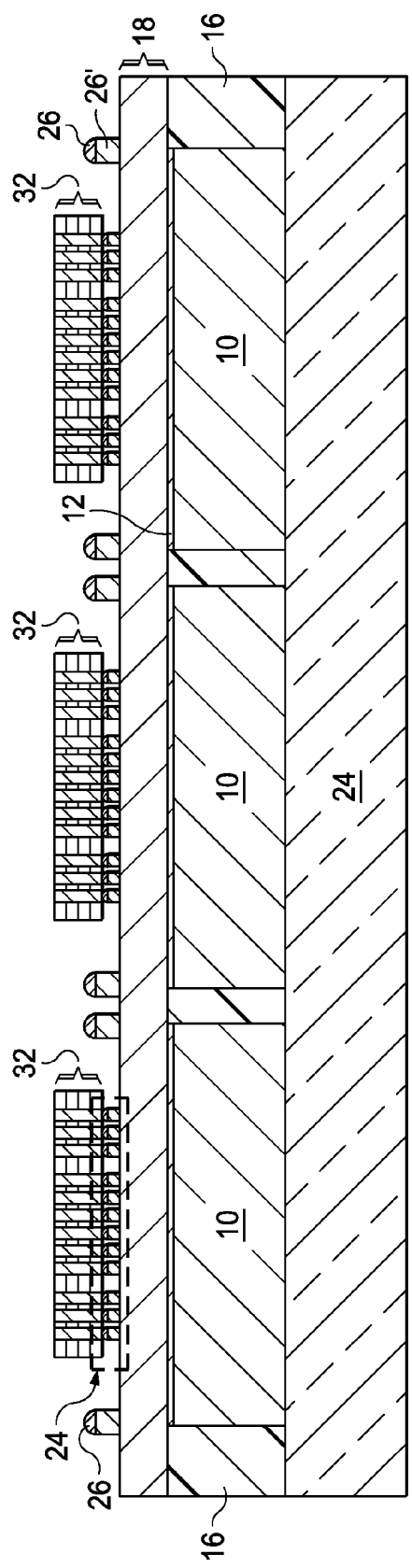

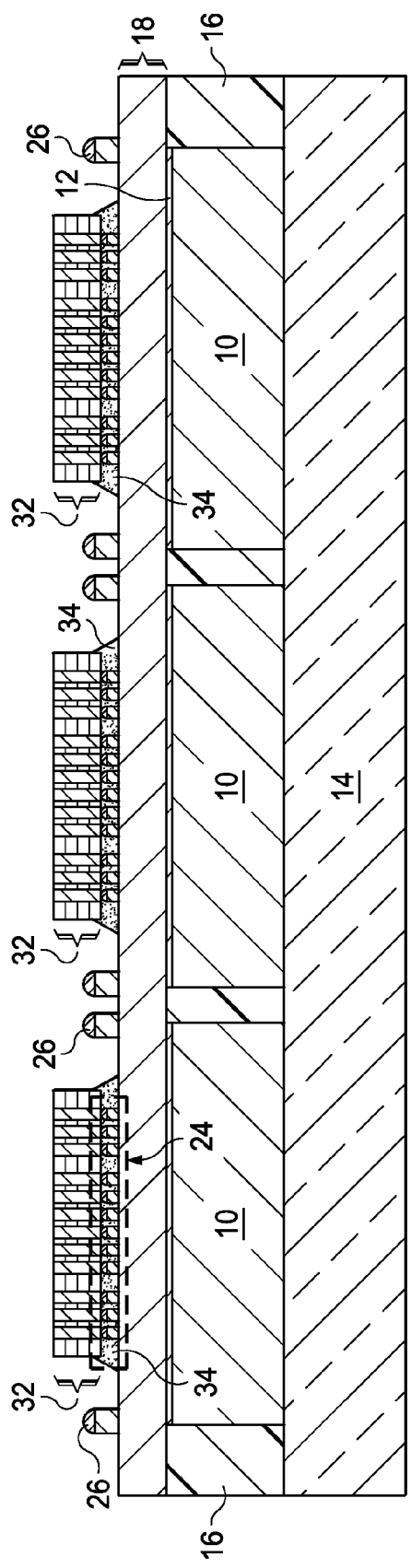
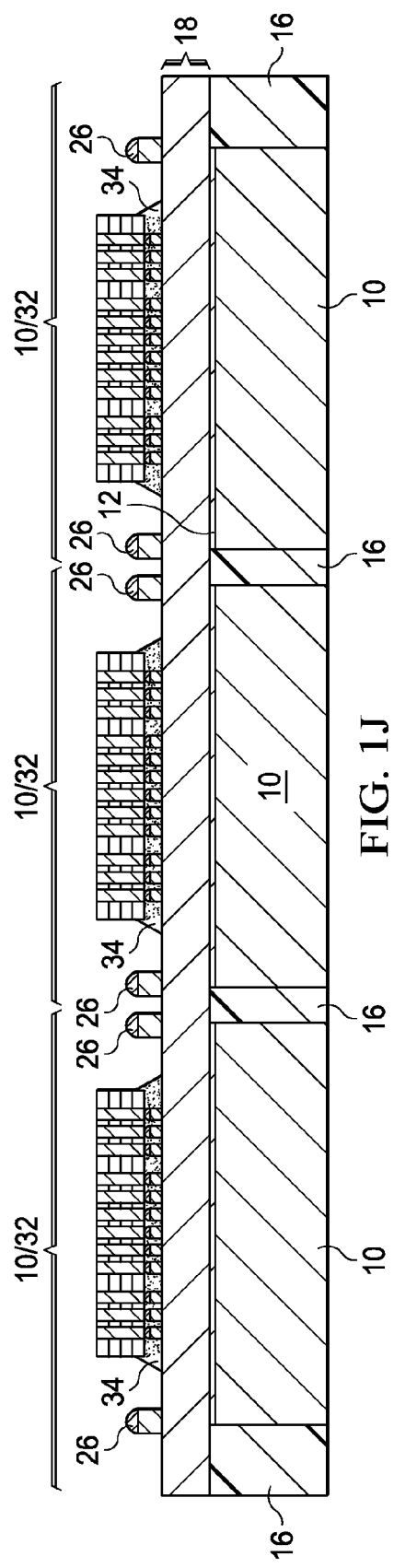
FIG. 1I
FIG. 1J

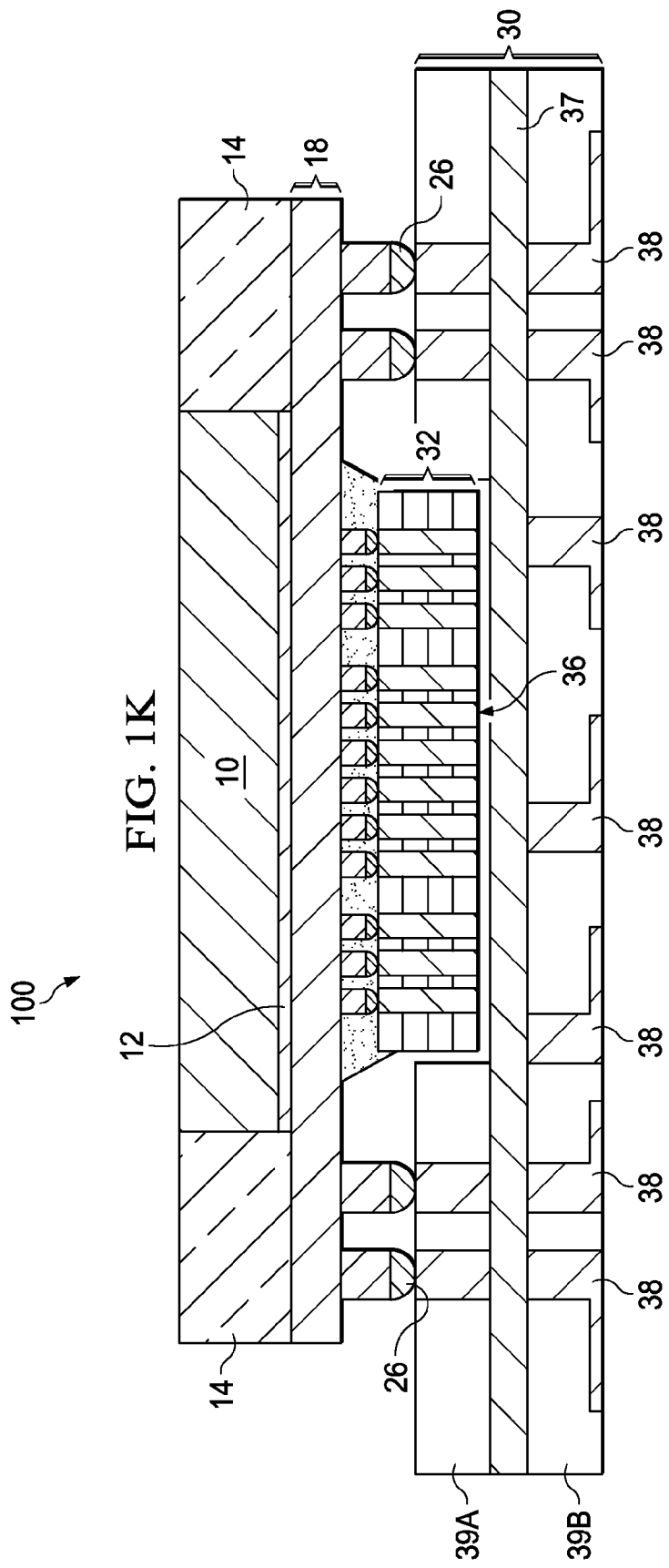

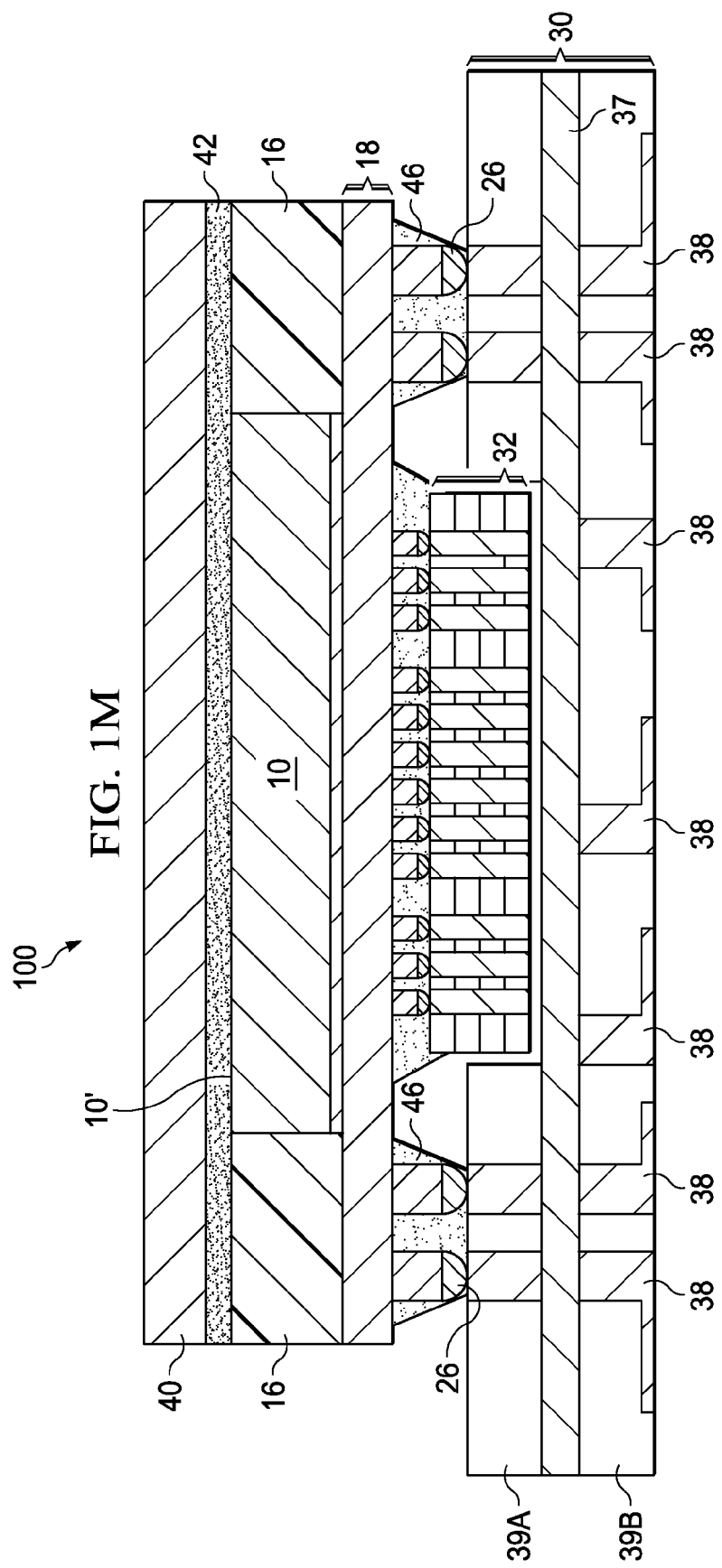

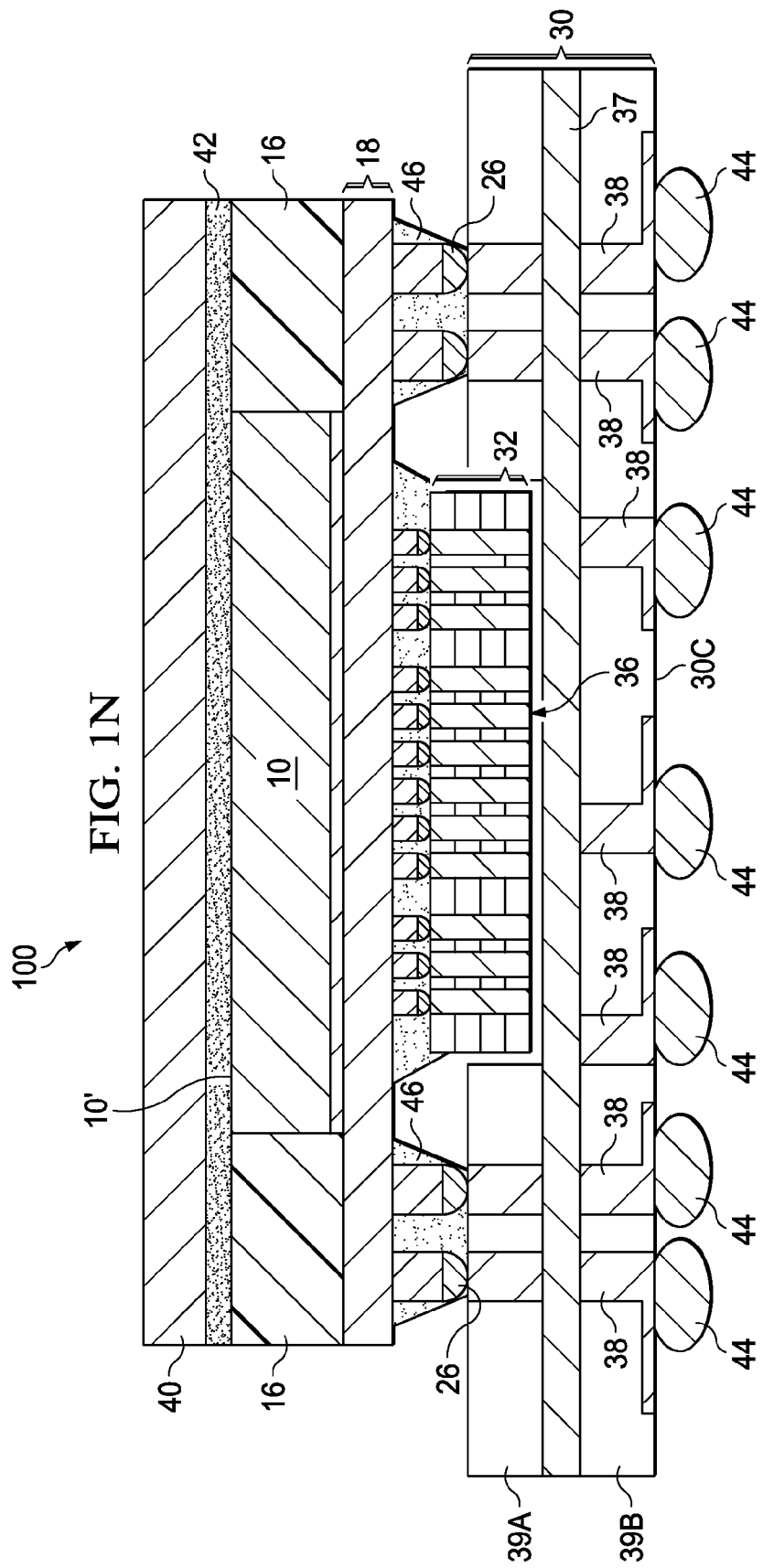

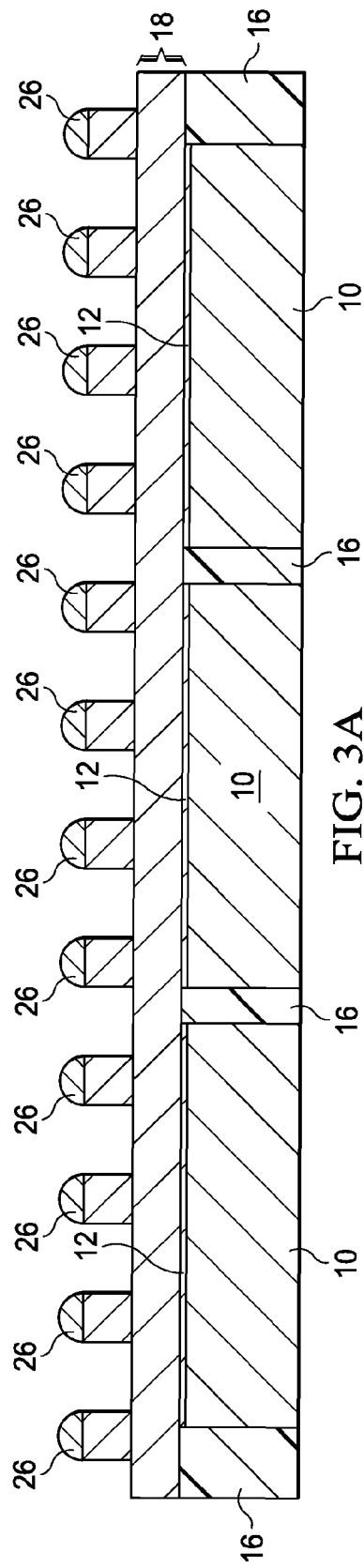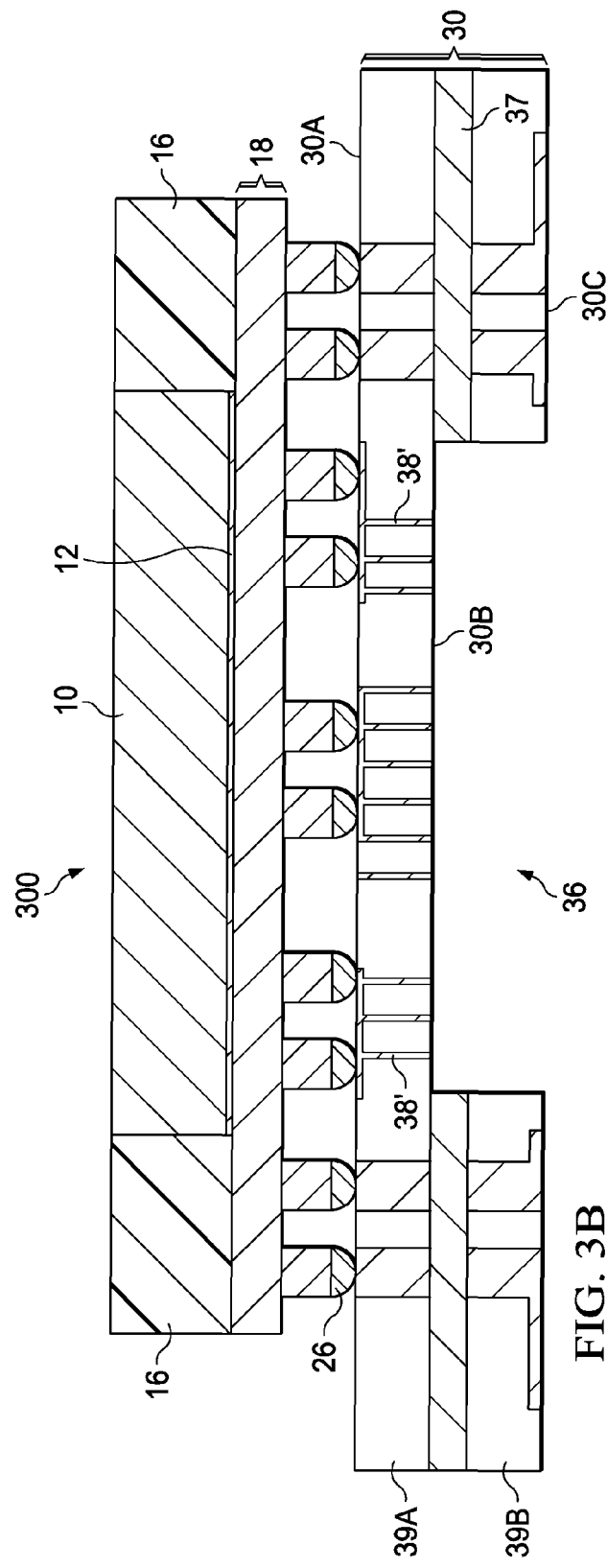

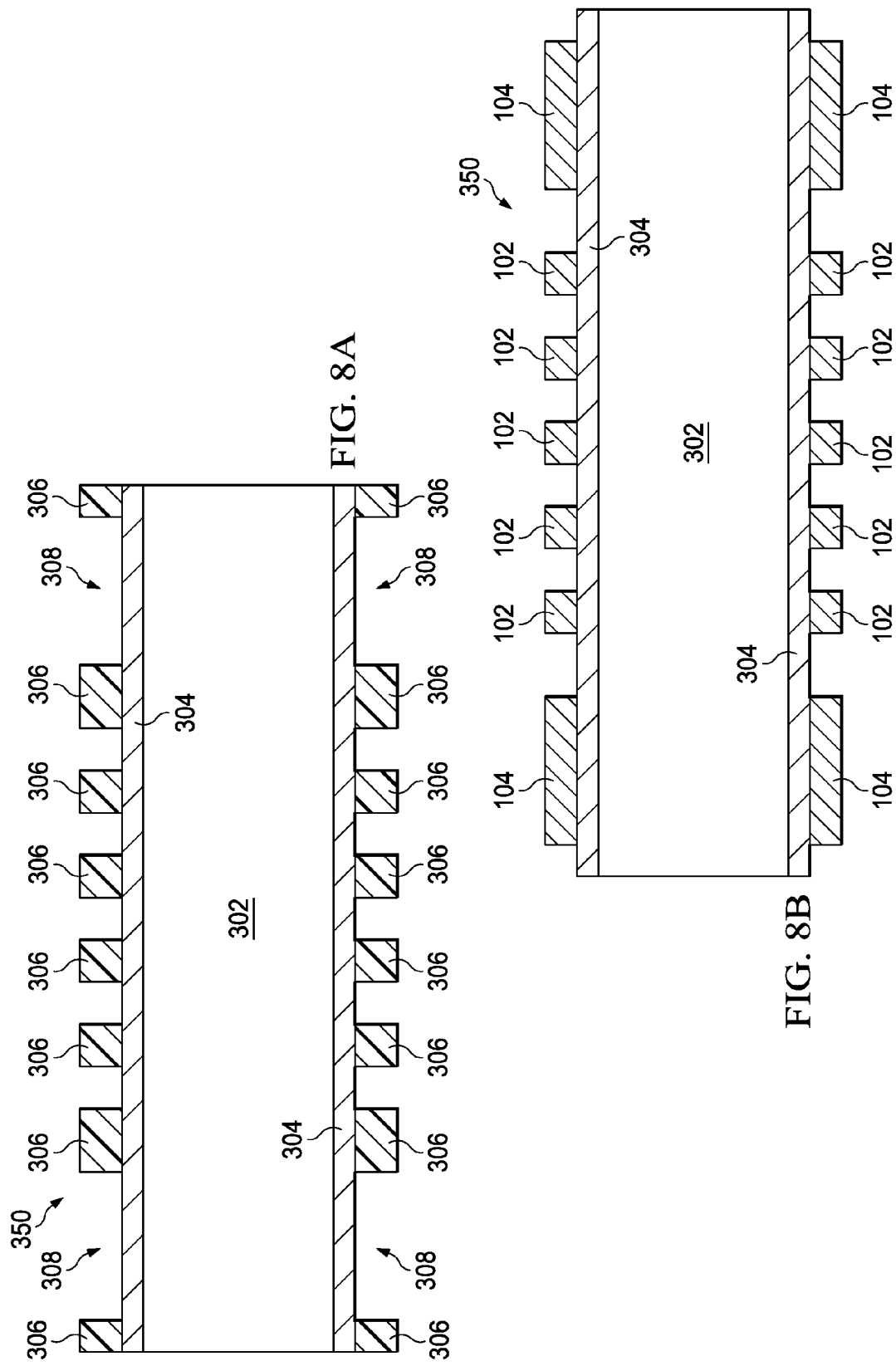

SUBSTRATE DESIGN FOR SEMICONDUCTOR PACKAGES AND METHOD OF FORMING SAME

PRIORITY CLAIM AND CROSS-REFERENCE

This application is a continuation-in-part of U.S. patent application Ser. No. 14/181,305, filed Feb. 14, 2014, which application is hereby incorporated herein by reference.

BACKGROUND

In an aspect of integrated circuit packaging technologies, individual semiconductor dies may formed and are initially isolated. These semiconductor dies may then be bonded together, and the resulting die stack may be connected to other package components such as package substrates (e.g., interposers, printed circuit boards, and the like) using connectors on a bottom die of the die stack.

The resulting packages are known as Three-Dimensional Integrated Circuits (3DICs). Top dies of a die stack may be electrically connected to the other package components through interconnect structures (e.g., through-substrate vias (TSVs)) in bottom dies of the die stack. However, existing 3DIC packages may include numerous limitations. For example, the bonded die stack and other package components may result in a large form factor and may require complex heat dissipation features. Existing interconnect structures (e.g., TSVs) of the bottom die may be costly to manufacture and result in long conduction paths (e.g., signal/power paths) to top dies of the die stack. Furthermore, solder bridges, warpage, and/or other defects may result in traditional 3DICs, particularly in packages having a high density of solder balls (e.g., package-on-package (PoP) configurations), thin package substrates, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A through 3E illustrate cross-sectional views of various intermediary stages of manufacturing a semiconductor package in accordance with some alternative embodiments;

DETAILED DESCRIPTION

Figure 1C:
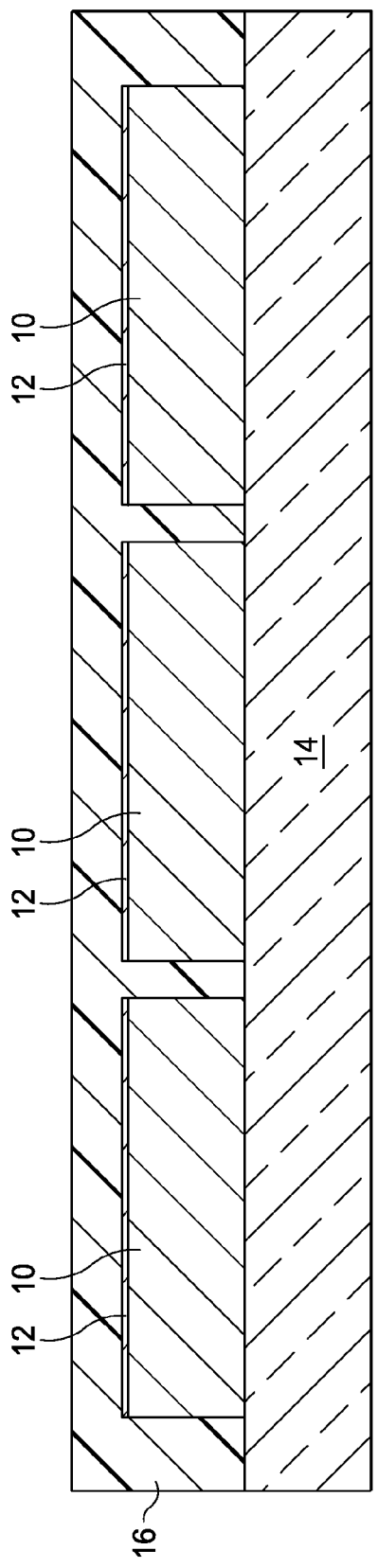
FIGS. 1A through 1N illustrate cross-sectional views of various intermediary stages of manufacturing a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments may include a plurality of first dies (e.g., memory dies) electrically connected to one or more second dies (e.g., logic dies) through first input/output (I/O) pads and redistribution layers (RDLs) formed on the second dies. The resulting die stack may be bonded to another package component such as an interposer, package substrate, printed circuit board, and the like through second I/O pads and the RDLs of the second dies. The package substrate may include a cavity, and the first dies may be disposed in the cavity. Thus, a three-dimensional integrated circuit (3DIC) such as a chip on fan-out package may be made with a relatively small form factor at a relatively low cost and having relatively short conduction paths (e.g., signal/power paths). Furthermore, one or more heat dissipation features may be independently formed on opposite surfaces of the first and/or second dies.

FIGS. 1A through 1N illustrate cross-sectional views of various intermediary stages of manufacturing an integrated circuit (IC) package 100 (see FIG. 1N) in accordance with various embodiments. FIG. 1A illustrates a plurality of dies 10. Dies 10 may include a substrate, active devices, and interconnect layers (not shown). The substrate may be a bulk silicon substrate although other semiconductor materials including group III, group IV, and group V elements may also be used. Alternatively, the substrate may be a silicon-on-insulator (SOI) substrate. Active devices such as transistors may be formed on the top surface of the substrate. Interconnect layers may be formed over the active devices and the substrate.

The interconnect layers may include an inter-layer dielectric (ILD)/inter-metal dielectric layers (IMDs) formed over the substrate. The ILD and IMDs may be formed of low-k dielectric materials having k values, for example, lower than about 4.0 or even about 2.8. In some embodiments, the ILD and IMDs comprise silicon oxide, SiCOH, and the like.

A contact layer 12 including one or more contact pads is formed over the interconnect structure and may be electrically coupled to the active devices through various metallic lines and vias in the interconnect layers. Contact pads in contact layer 12 may be made of a metallic material such as aluminum, although other metallic materials may also be used. A passivation layer (not shown) may be formed over contact layer 12 out of non-organic materials such as silicon oxide, un-doped silicate glass, silicon oxynitride, and the like. The passivation layer may extend over and cover edge portions of contact pads in contact layer 12. Openings may be formed in portions of the passivation layer that cover the contact pads, exposing at least a portion of the contact pads in contact layer 12. The various features of dies 10 may be formed by any suitable method and are not described in further detail herein. Furthermore, dies 10 may be formed in a wafer (not shown) and singulated. Functional testing may be performed on dies 10. Thus, dies 10 in FIG. 1A may include only known good dies, which have passed one or more functional quality tests.

Next, referring to FIG. 1B, dies 10 may be placed on a carrier 14. Carrier 14 may be made of a suitable material, for example, glass or a carrier tape. Dies 10 may be affixed to carrier 14 through one or more adhesive layers (not shown). The adhesive layers may be formed of any temporary adhesive material such as ultraviolet (UV) tape, wax, glue, and the like. In some embodiments, the adhesive layers may further include a die attach film (DAF), which may have optionally been formed under dies 10 prior to their placement on carrier 14.

In FIG. 1C, a molding compound 16 may be used to fill gaps between dies 10 and to cover top surfaces of dies 10. Molding compound 16 may include any suitable material such as an epoxy resin, a molding underfill, and the like. Suitable methods for forming molding compound 16 may include compressive molding, transfer molding, liquid encapsulent molding, and the like. For example, molding compound 16 may be dispensed between dies 10 in liquid form. A curing process may then be performed to solidify molding compound 16.

Figure 1D:
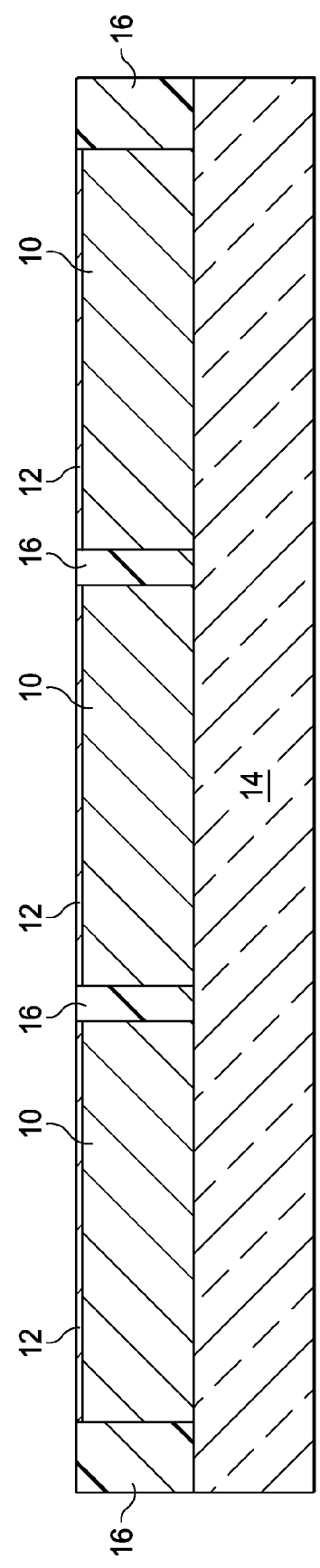

In FIG. 1D, a planarization process, such as a grinding process (e.g., a chemical-mechanical polish (CMP) or mechanical grinding) or etch back, may be performed on molding compound 16 to expose contact layer 12 (and any contact pads therein) on dies 10. In a top down view of dies 10 (not shown), molding compound 16 may encircle dies 10.

FIG. 1E illustrates the formation of redistribution layers (RDLs) 18 over dies 10 and molding compound 16. As illustrated by FIG. 1E, RDLs 18 may extend laterally past edges of dies 10 over molding compound 16. RDLs 18 may include interconnect structures 20 formed in one or more polymer layers 22. Polymer layers 22 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, and the like.

Interconnect structures 20 (e.g., conductive lines and/or vias) may be formed in polymer layers 22 and electrically connected to contact layer 12 of dies 10. The formation of interconnect structures 20 may include patterning polymer layers 22 (e.g., using a combination of photolithography and etching processes) and forming interconnect structures 20 (e.g., depositing a seed layer and using a mask layer to define the shape of interconnect structures 20) in the patterned polymer layers 22. Interconnect structures 20 may be formed of copper or a copper alloy although other metals such as aluminum, gold, and the like may also be used. Interconnect structures 20 may be electrically connected to contact pads in contact layer 12 (and as a result, active devices) in dies 10.

FIGS. 1F and 1G illustrate the formation of connectors 24 and 26 over RDLs 18. Notably, connectors 24 and 26 are formed on a same side of dies 10 (i.e., on a same surface of RDLs 18). Connectors 24 and 26 may be formed of any suitable material (e.g., copper, solder, and the like) using any suitable method. In some embodiments, the formation of connectors 24 and 26 may first include the formation of under bump metallurgies (UBMs) 24'/26' electrically connected to active devices in dies 10 through RDLs 18. Connectors 24 and 26 may extend laterally past edges of dies 10, forming fan-out interconnect structures. Thus, the inclusion of RDLs 18 may increase the number of connectors 24 and 26 (e.g., input/output pads) connected to dies 10. The increased number of connectors 24 and 26 may allow for increased bandwidth, increased processing speed (e.g., due to shorter signaling paths), lower power consumption (e.g., due to shorter power conduction paths), and the like in subsequently formed IC packages (e.g., package 100 of FIG. 1N).

Furthermore, connectors 24 and 26 may vary in size. For example, connectors 24 may be microbumps having a pitch of about 40 µm or more while connectors 26 may be controlled collapse chip connection (C4) bumps having a pitch of about 140 µm to about 150 µm. In alternative embodiments, connectors 24 and 26 may include different dimensions. Thus, as illustrated by FIGS. 1F and 1G, connectors 24 may be formed prior to connectors 26 to allow for the size differences.

The differing sizes of connectors 24 and 26 may allow different electrical devices (e.g., having differently sized connectors) to be bonded to dies 10. For example, connectors 24 may be used to electrically connect dies 10 to one or more other device dies 28 (see FIG. 1H), and connectors 26 may be used to electrically connect dies 10 to a package substrate 30 (e.g., a printed circuit board, interposer, and the like, see FIG. 1K). Furthermore, because connectors 24 and 26 are formed on a same side of dies 10, the different electrical devices may also be bonded to a same side of dies 10. Although a particular configuration of dies 10 and RDLs 18 is illustrated, alternative configurations may be applied (e.g., having a different number of RDLs 18 and/or connectors 24/26) in alternative embodiments.

In FIG. 1H, a plurality of dies 32 may be bonded to dies 10 through connectors 24 (e.g., by reflowing connectors 24) to form die stacks 10/32. Dies 32 may be electrically connected to active devices in dies 10 through RDLs 18. In some embodiments, die stack 10/32 may include memory dies 32 (e.g., dynamic random access memory (DRAM) dies) bonded to dies 10, which may be logic dies providing control functionality for memory dies 32. In alternative embodiments, other types of dies may be included in dies stacks 10/32. Next, as illustrated in FIG. 1I, underfill 34 may be dispensed between dies 32 and RDLs 18 around connectors 24. Underfill 34 may provide support for connectors 24.

FIG. 1J illustrates the removal of carrier 14 from die stack 10/32 using any suitable method. For example, in an embodiment in which the adhesive between dies 10 and carrier 14 is formed of UV tape, dies 10 may be removed by exposing the adhesive layer to UV light. Subsequently, die stacks 10/34 may be singulated for packaging in an IC package. The singulation of die stacks 10/34 may include the use of a suitable pick-and-place tool.

Figure 1L:
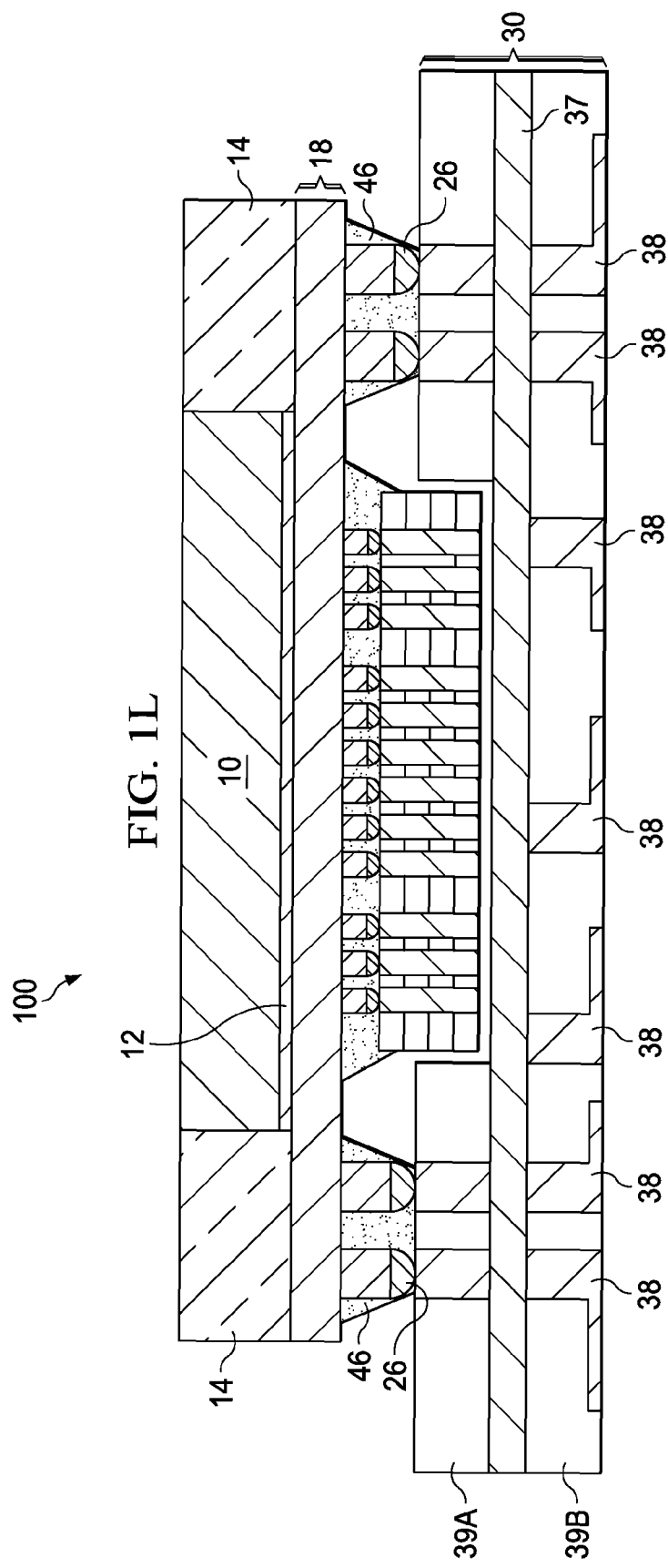

Next, as illustrated by FIG. 1K, each die stack 10/32 may be bonded to a package substrate 30 through connectors 26. A reflow may be performed on connectors 26 to bond die stack 10/32 to package substrate 30. Subsequently, as illustrated by FIG. 1L, an underfill 46 may be dispensed between die stack 10/32 and package substrate 30 around connectors 26. Underfill 46 may be substantially similar to underfill 34.

Package substrate 30 may be an interposer, a printed circuit board (PCB), and the like. For example, package substrate 30 may include a core 37 and one or more build-up layers 39 (labeled 39A and 39B) disposed on either side of core 37. Interconnect structures 38 (e.g., conductive lines, vias, and/or through vias) may be included in package substrate 30 to provide functional electrical purposes such as power, ground, and/or signal layers. Other configurations of package substrate 30 may also be used.

Furthermore, package substrate 30 may include a cavity 36. Cavity 36 may not extend through package substrate 30. Rather, a portion or all of build-up layers 39A (e.g., build-up layers 39 disposed on a same side of core 37 as die stack 10/32) may be patterned to form cavity 36. As illustrated in FIG. 1L, cavity 36 may not affect the configuration of core 37 and/or build-up layers 39B (e.g., build-up layers 39 disposed on an opposite side of core 37 as die stack 10/32). The configuration of package substrate 30 may be designed so that active interconnect structures 38 (e.g., power, ground, and/or signal layers in build-up layers 39A) may be routed to avoid cavity 36. Thus, cavity 36 may not substantially interfere with the functionality of package substrate 30.

Figure 4B:
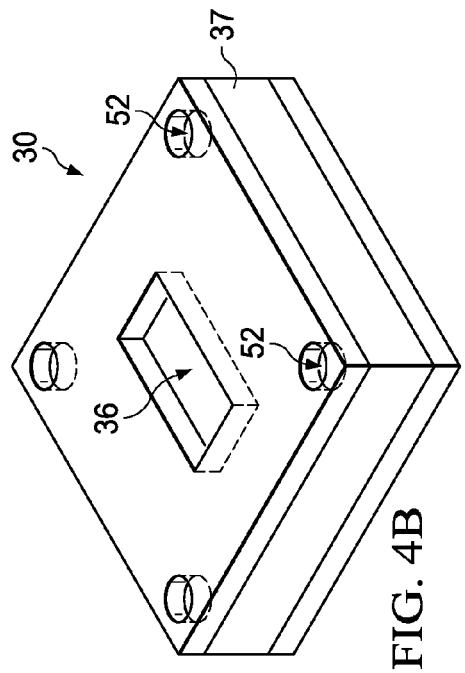
FIGS. 4A through 4L illustrate prospective views of various intermediary stages of manufacturing a package substrate in accordance with some embodiments.
Figure 4D:
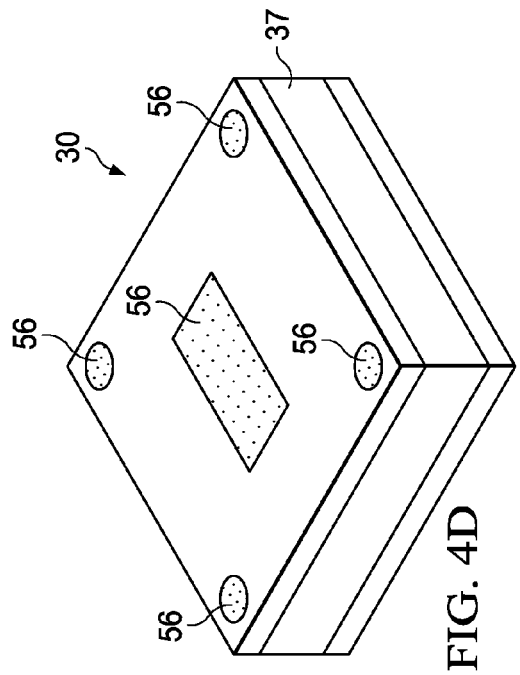
Figure 4A:
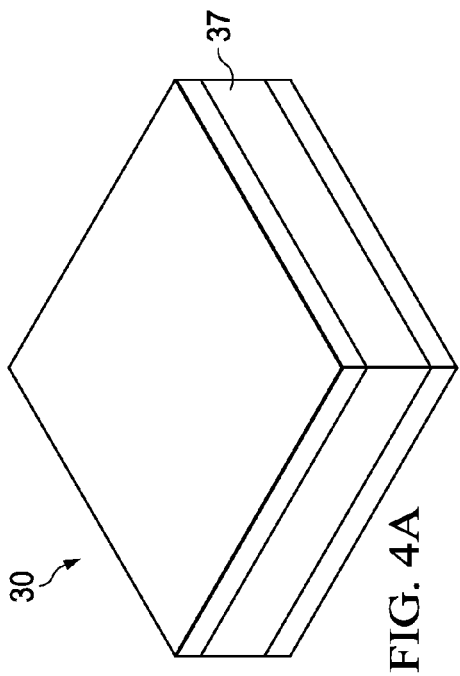

Package substrate 30 may be formed using any suitable method. For example, FIGS. 4A through 4L illustrate prospective views of various intermediary stages of manufacturing a package substrate 30 in accordance with various embodiments. In FIG. 4A, core 37 is provided. Core 37 may be a metal-clad insulated base material such as a copper-clad epoxy-impregnated glass-cloth laminate, a copper-clad polyimide-impregnated glass-cloth laminate, or the like. As illustrated by FIG. 4B, cavity 36 and/or through holes 52 may be formed in core 37, for example, using a mechanical drilling or milling process. The mechanical drilling/milling process may extend through holes 52 through core 37. However, the mechanical drilling/milling process may not extend cavity 36 through core 37.

Figure 4C:
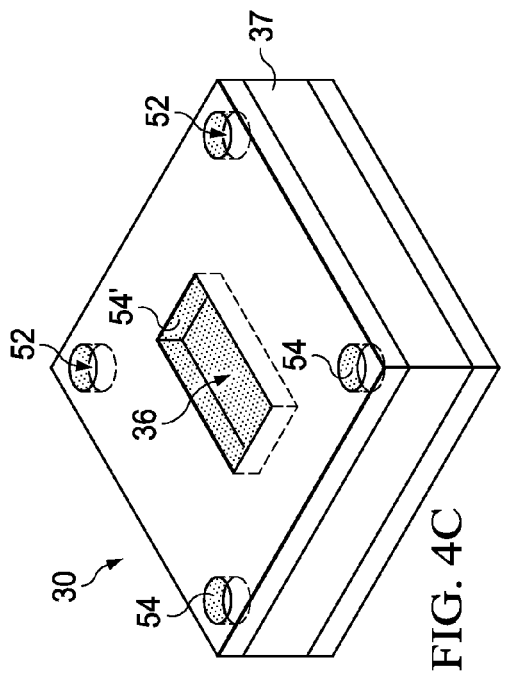

Next, in FIG. 4C, surfaces of through hole 52 and cavity 36 may be plated with metallic material 54, for example, using an electrochemical plating process. In some embodiments, metallic material 54 may comprise copper. The plating of through holes 52 may form through vias for providing electrical connections from one side of core 37 to another. Furthermore, metallic material 54' on surfaces of cavity 36 may act as a laser stop layer in subsequent process steps (see FIG. 4K). In FIG. 4D, cavity 36 and through holes 52 may be filled with a suitable material 56 (e.g., an ink). Material 56 may fill cavity 36/through holes 52 to provide a substantially level surface for forming one or more build-up layers over core 37. A grinding or other planarization technique may be performed on core 37.

Figure 4E:
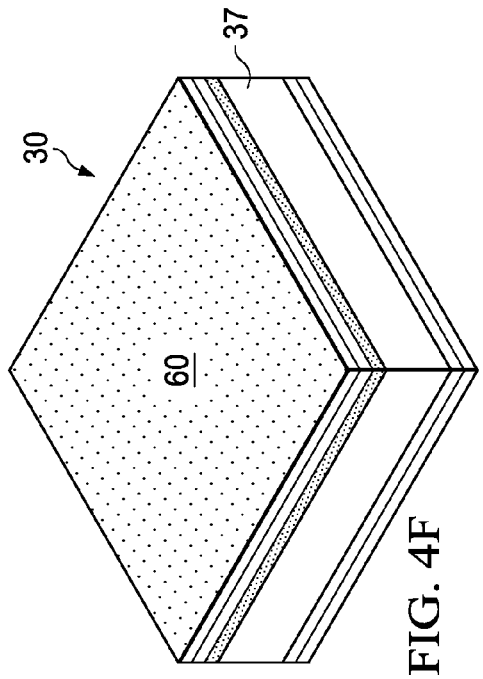
Figure 4F:
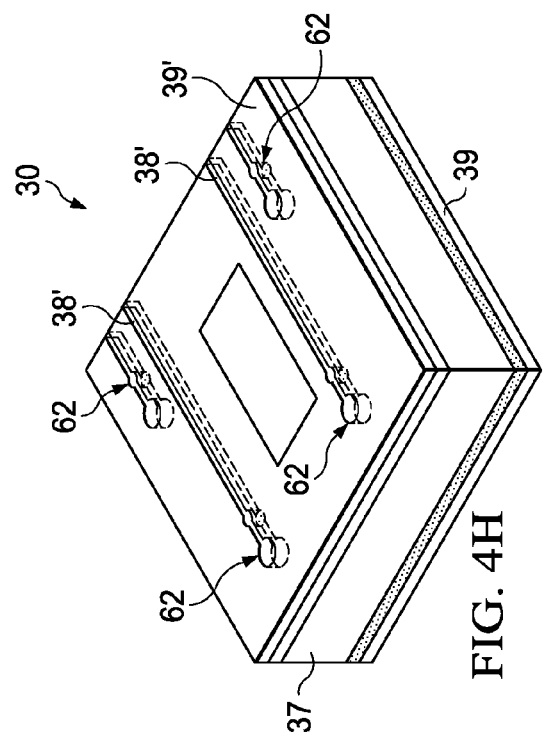
Figure 4G:
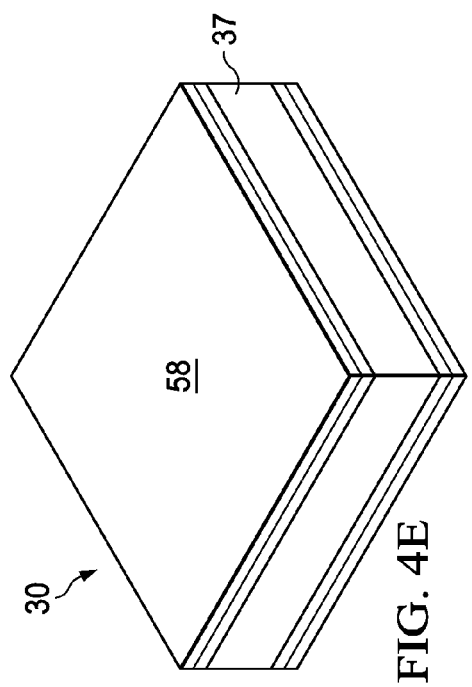

As illustrated by FIGS. 4E through 4I, one or more build-up layers 39 having interconnect structures 38 may be formed on either side of core 37. The formation of build-up layers 39 may include plating core 37 with a conductive layer 58, for example, comprising copper as illustrated by FIG. 4E. Next, as illustrated by FIGS. 4F and 4G, conductive layer 58 may be patterned to form conductive lines 38'. The patterning of conductive layer 58 may include laminating a dry film 60 (e.g., a photoresist) over conductive layer 58, patterning dry film 60 (e.g., using suitable exposure techniques), and etching conductive layer 58 using the patterned dry film 60 as a mask. Subsequently, dry film 60 may be removed.

Figure 4H:
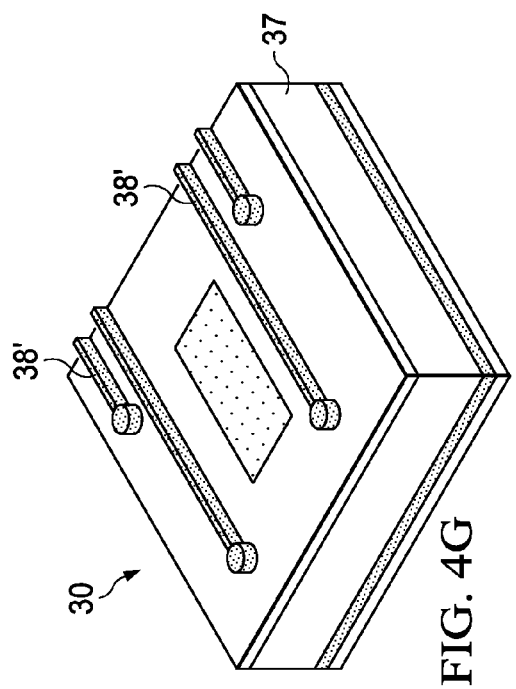
Figure 4I:
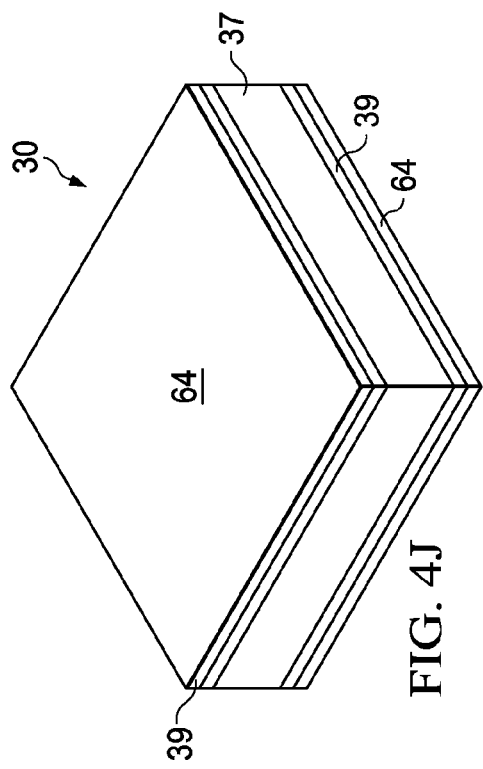

In FIG. 4H, a build-up layer 39' may be laminated over conductive lines 38' (shown in ghost). The lamination of build-up layer 39' may include a curing process (e.g., a heat treatment or pressing process). Openings 62 may be patterned in build-up layer 39' (e.g., through laser drilling), and openings 62 may be aligned with conductive lines 38'. As illustrated by FIG. 4I, additional conductive lines 38'' may be formed over build-up layer 39' using a substantially similar process as illustrated by FIGS. 4E through 4H for forming conductive lines 38' (e.g., conductive layer plating and patterning). The conductive layer plating process used for forming conductive lines 38'' may also plate openings 62 (not illustrated in FIG. 4H), thus forming conductive vias (not illustrated) for interconnecting conductive lines 38' and 38'' through build-up layer 39'. Conductive lines 38'' may be patterned to align with conductive vias formed in openings 62. The process steps illustrated by FIGS. 4E through 4I may be repeated as desired to form any number of build-up layers (e.g., power, ground, and/or signal layers) in package substrate 30. Furthermore, although FIGS. 4E through 4I only illustrate the formation of interconnect structures 38/build-up layers 39 on one side of core 37, similar processes may be applied to form of interconnect structures 38/build-up layers 39 on an opposing side of core 37.

Figure 4J:
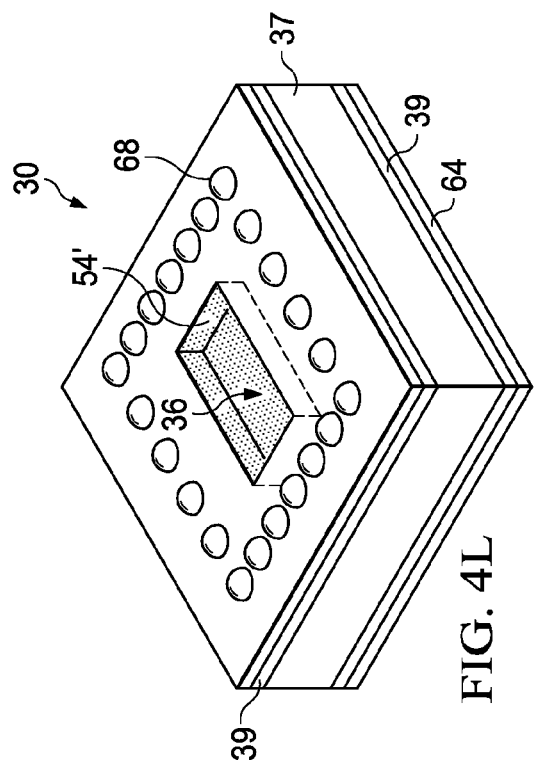
Figure 4K:
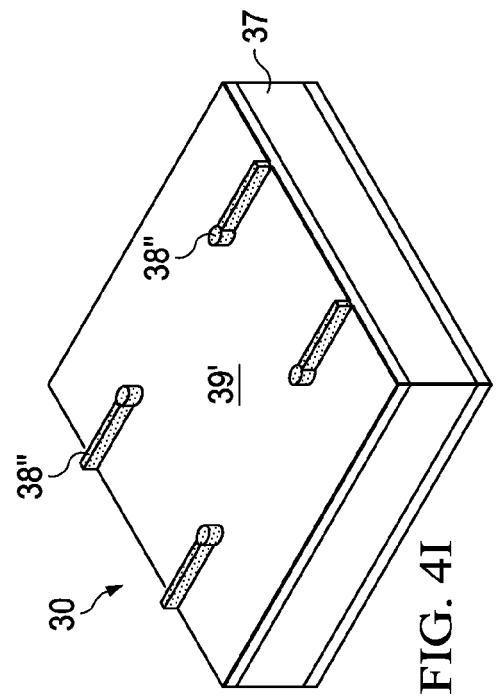
Figure 4L:
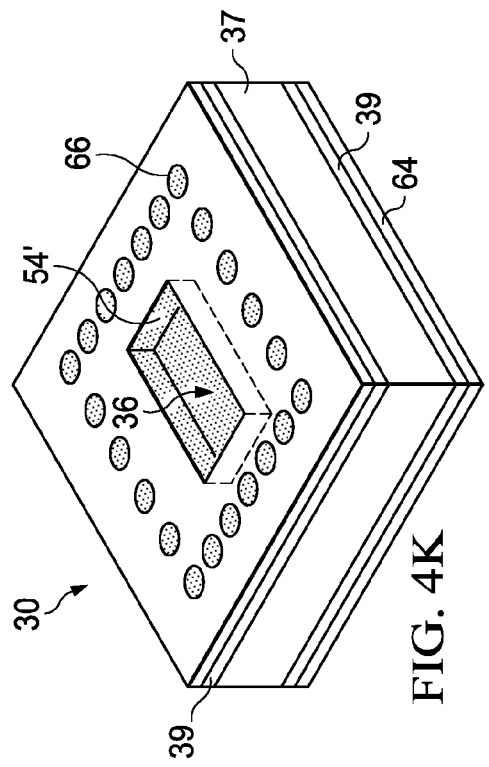

FIG. 4J a solder resist 64 may be formed over build-up layers 39 (e.g., on both sides of core 37). Next, as illustrated by FIG. 4K, cavity 36 may be patterned in package substrate 30. The formation of cavity 36 may include patterning solder resist 63 (e.g., using an exposure technique) and a laser etching build-up layers 39 using material 54' as a laser stop layer. Thus, cavity 36 may not extend through package substrate 30. Furthermore, the patterning of solder resist 64 may pattern openings (not shown) around cavity 36 to expose interconnect structures 38 in build-up layers 39. These openings may be plated with a suitable material (e.g., nickel, aluminum, or the like) to form contact pads 66 on package substrate 30. Contact pads 66 may be electrically connected to interconnect structures 38 in build-up layers 39. Subsequently, as illustrated by FIG. 4L, connectors 68 (e.g., solder balls) may be formed on contact pads 66 for bonding with die stack 10/32.

Referring back to FIG. 1L, when die stack 10/34 is bonded to package substrate 30, dies 32 may be disposed, at least partially, in cavity 36. In a top down view of package 100 (not shown), cavity 36 may encircle dies 32. Thus, the bonded structure may advantageously have a relatively small form factor and higher bandwidth. Furthermore, dies 32 may be electrically connected to package substrate 30 through RDLs 18 and connectors 24/26. In some embodiments, dies 10 may include fewer or be substantially free of through-substrate vias (TSVs) for electrically connecting dies 32 to package substrate 30. The reduced number of TSVs may lower the cost of manufacturing dies 10.

Next, referring to FIG. 1M, a heat dissipation feature 40 is disposed over die 10. Heat dissipation feature 40 may be disposed on a surface of die 10 opposite RDLs 18, connectors 24, and dies 32. Heat dissipation feature 40 may be a contour lid having a high thermal conductivity, for example, between about 200 watts per meter kelvin (W/m·K) to about 400 W/m·K or more, and may be formed using a metal, a metal alloy, and the like. For example, heat dissipation feature 40 may comprise metals and/or metal alloys such as Al, Cu, Ni, Co, combinations thereof, and the like. Heat dissipation feature 40 may also be formed of a composite material, for example silicon carbide, aluminum nitride, graphite, and the like. In some embodiments, heat dissipation feature 40 may also extend over surfaces of molding compound 16.

Compared to conventional 3DICs, where package substrate 30 and dies 32 would be disposed on opposing sides of die 10, package 100 provides die 10 with a surface 10', which may not be used to electrically connect to dies 32 or package substrate 30. Thus, heat dissipation feature 40 may be directly disposed on surface 10' of die 10 for improved heat dissipation.

Interfacing material 42 may be disposed between heat dissipation features 40 and die 10/molding compound 16. Interfacing material 42 may include a thermal interface material (TIM), for example, a polymer having a good thermal conductivity, which may be between about 3 watts per meter kelvin (W/m·K) to about 5 W/m·K or more. Because the TIM may have good thermal conductivity, the TIM may be disposed directly between (e.g., contacting) die 10 and heat dissipation feature 40. Furthermore, interfacing material 42 may also include an adhesive (e.g., an epoxy, silicon resin, and the like) for affixing heat dissipation lid 40 to die 10/molding compound 16. The adhesive used may have a better adhering ability and a lower thermal conductivity than a TIM. For example, the adhesive used may have a thermal conductivity lower than about 0.5 W/m·K. As such, the adhesive portions of interfacing material 42 may be disposed over areas having lower thermal dissipation needs (e.g., over surfaces of molding compound 16).

After the attachment of heat dissipation feature 40, a marking process (e.g., laser marking) may be performed to mark package 100. Furthermore, as illustrated by FIG. 1N, connectors 44 (e.g., ball grid array (BGA) balls) disposed on a surface of package substrate 30 opposite connectors 26 and die stack 10/32. Connectors 44 may be used to electrically connect package 100 to a motherboard (not shown) or another device component of an electrical system.

FIG. 1N illustrates a completed package 100. Because dies 32 is disposed in a cavity 36 of package substrate 30, package 100 may have a relatively small form factor and higher bandwidth. The inclusion of RDL 18 may allow for a greater number of I/O pads for die stack 10/32, which allows various performance advantages such as increased speed, lower power consumption, and the like. Furthermore, package substrate 30 and dies 32 may be disposed on a same side of die 10, allowing heat dissipation feature 40 to be directly disposed on a surface of die 10 for improved heat dissipation.

Figure 2:
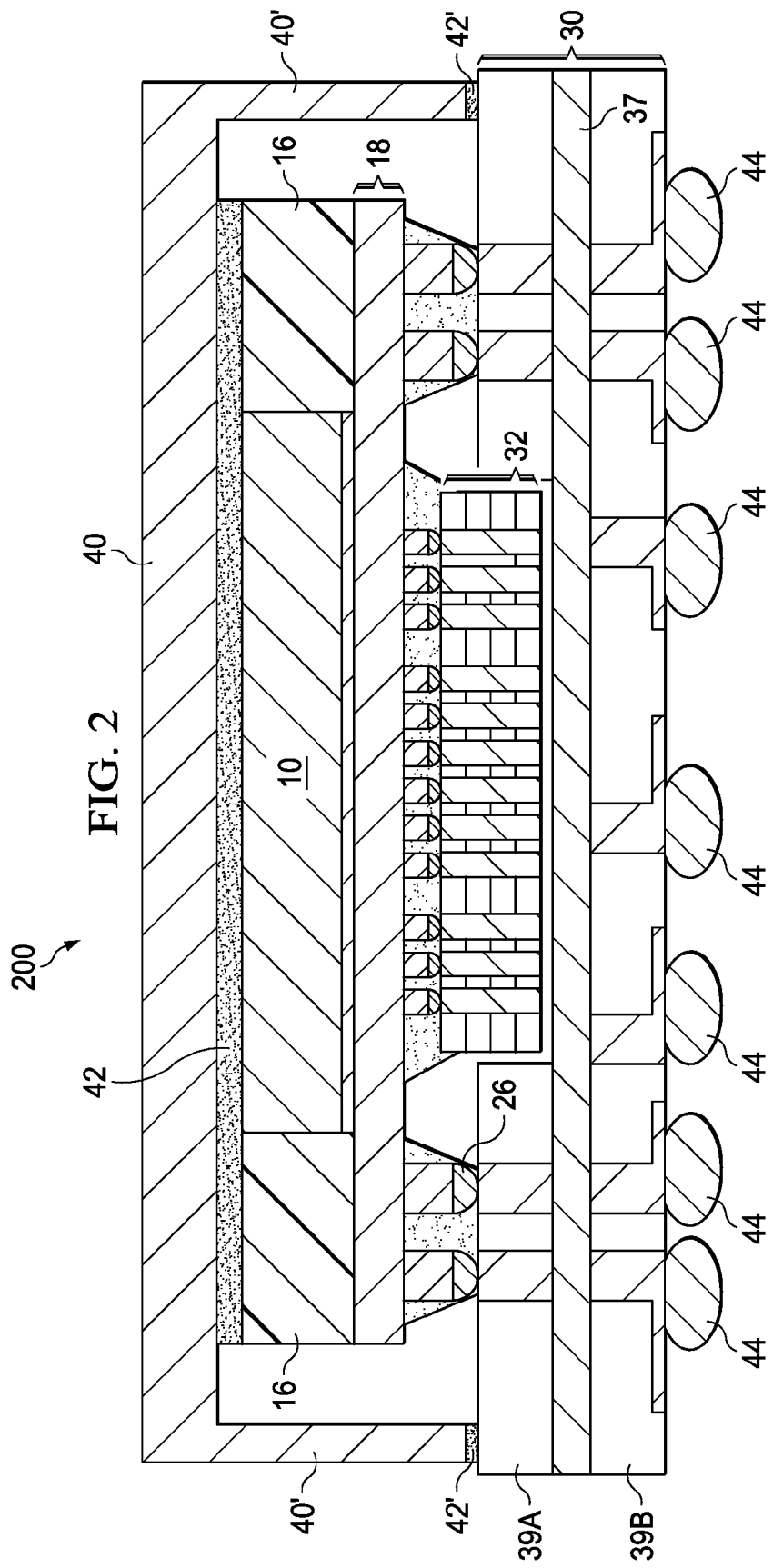
FIG. 2 illustrates a cross-sectional view a semiconductor package in accordance with some alternative embodiments.

FIG. 2 illustrates a cross-sectional view of a package 200 in accordance with various alternative embodiments. Package 200 may be substantially similar to the package 100 where like reference numerals represent like elements. However, heat dissipation feature 40 may include a contour ring portion 40', which may extend past die 10 and RDLs 18 to a top surface of package substrate 30. In a top down view of package 200 (not shown), contour ring portion 40' may encircle die 10. Contour ring portion 40' may be formed of substantially similar materials as the remainder of heat dissipation lid 40 (e.g., a high Tk material) and provide additional heat dissipation for package 200. Contour ring portion 40' may be attached to package substrate 30 using any suitable method such as an adhesive layer 42' disposed between contour ring portion 40' and package substrate 30.

Figure 3C:
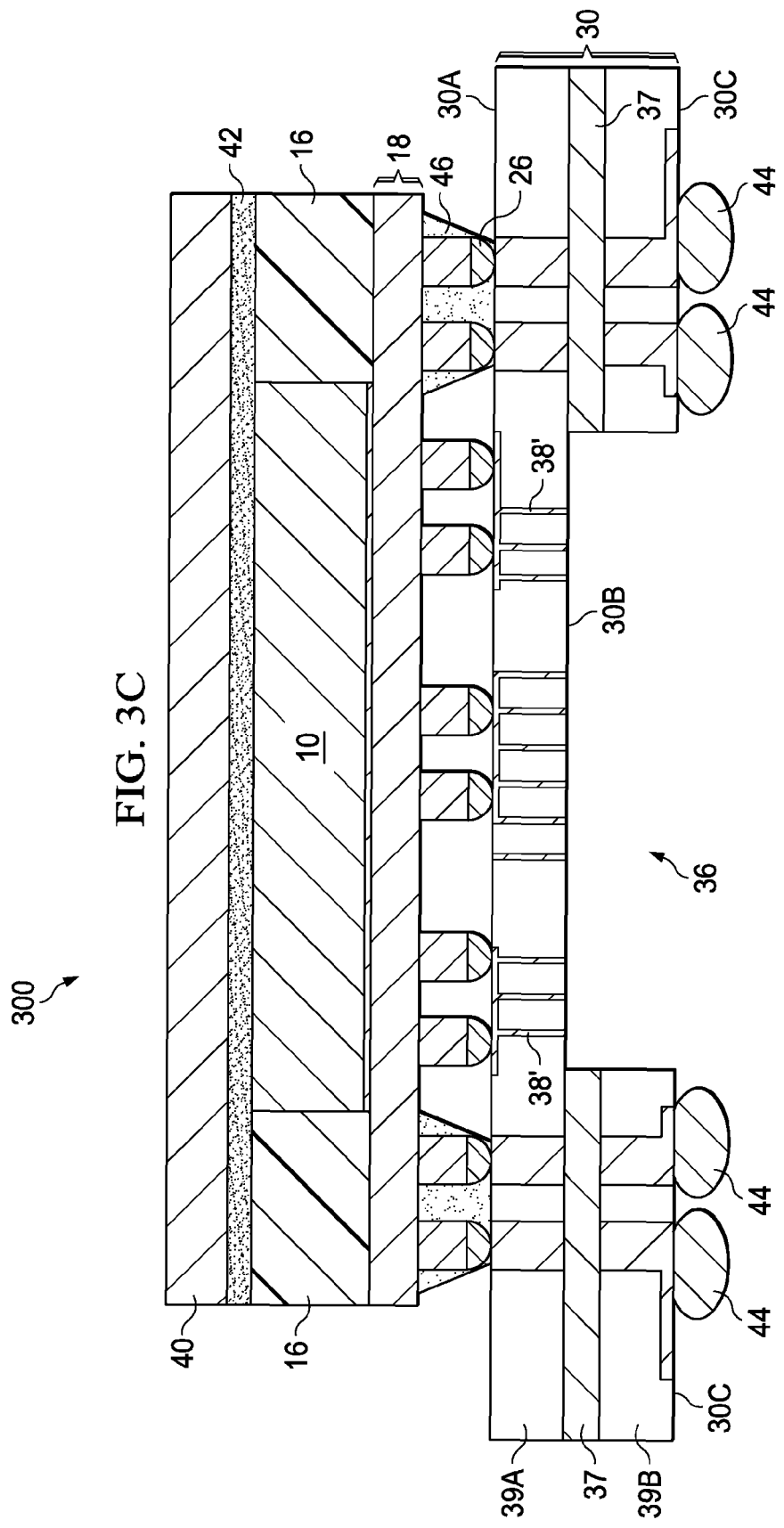

FIGS. 3A through 3E illustrates various intermediary steps of manufacturing package 300 in accordance with alternative embodiments. FIG. 3A illustrates a plurality of dies 10 having an RDL 18 and connectors 26 formed over dies 10. The various features illustrated in FIG. 2A may be formed using substantially the same steps and be substantially similar to the features formed in FIGS. 1A through 1J where like reference numerals represent like elements. Thus, detailed description of the features and their formation is omitted for brevity. However, as illustrated by FIG. 2A, dies 10 (including RDLs 18 and connectors 24) may be detached from a carrier (e.g., carrier 14) without the bonding on dies 32. Furthermore, connectors 24 may not be formed over RDLs 18. Instead, the structure illustrated in FIG. 2A includes connectors 26 on RDLs 18 may be of substantially the same size. For example, connectors 26 may be C4 bumps.

FIG. 3B illustrates the singulation of dies 10 (e.g., along scribe lines using a suitable pick and place tool) and the attachment of dies 10 to package substrate 30 through connectors 26. Notably, die 10 may be bonded to package substrate 30 prior to the attachment of dies 32 to package 300.

The configuration of package substrate 30 in package 300 may be altered from the configuration in package 100. For example, cavity 36 may be disposed on an opposing side (rather than a same side) of package substrate 30. In package 300, die 10 may be bonded to a surface 30A of package substrate 30. Surface 30A may be substantially level. Package substrate 30 may further include surface 30B (e.g., in cavity 36) and surface 30C opposing die 10. Due to the inclusion of cavity 36, surfaces 30B and 30C may not be substantially level. For example, in the orientation illustrated by FIG. 3B, surface 30B may be higher than surface 30C.

The formation of package substrate 30 having cavity 36 may include the patterning of core 37, build-up layer 39B (e.g., disposed on an opposing side of core 37 as die 10), and/or build-up layer 39A (e.g., disposed on a same side of core 37 as die 10). In various embodiments, cavity 36 may not extend through package substrate 30.

FIG. 3C illustrates the formation of various other features of package 300. For example, a reflow may be performed on connectors 26 and underfill 46 may be dispensed around connectors 26. Connectors 44 may be attached to surface 30C of package substrate 30 opposite die 10. Furthermore, a heat dissipation feature 40 may be disposed over die 10/molding compound 16. An interfacing material 42 (e.g., including a TIM and/or adhesive material) may be disposed between heat dissipation feature 40 and die 10/molding compound 16.

Figure 3D:
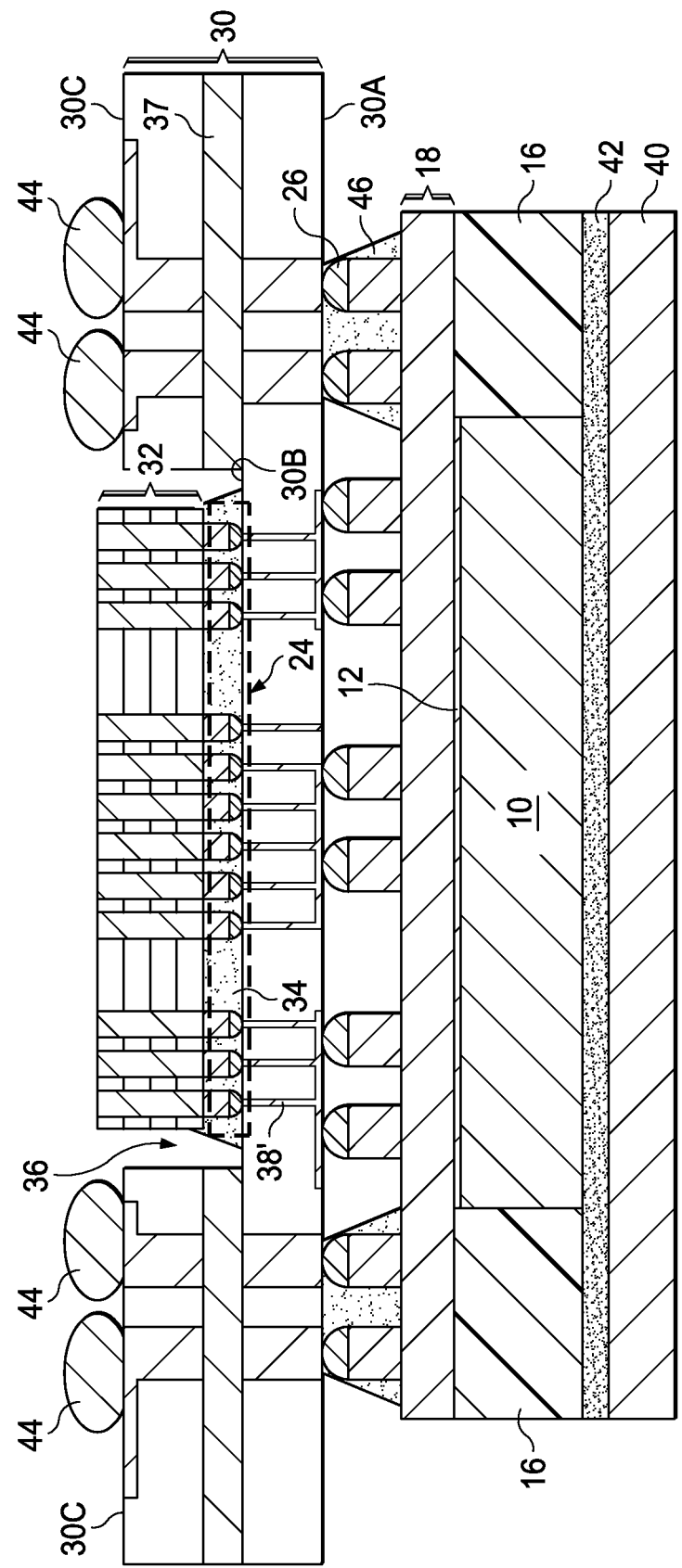
Figure 3E:
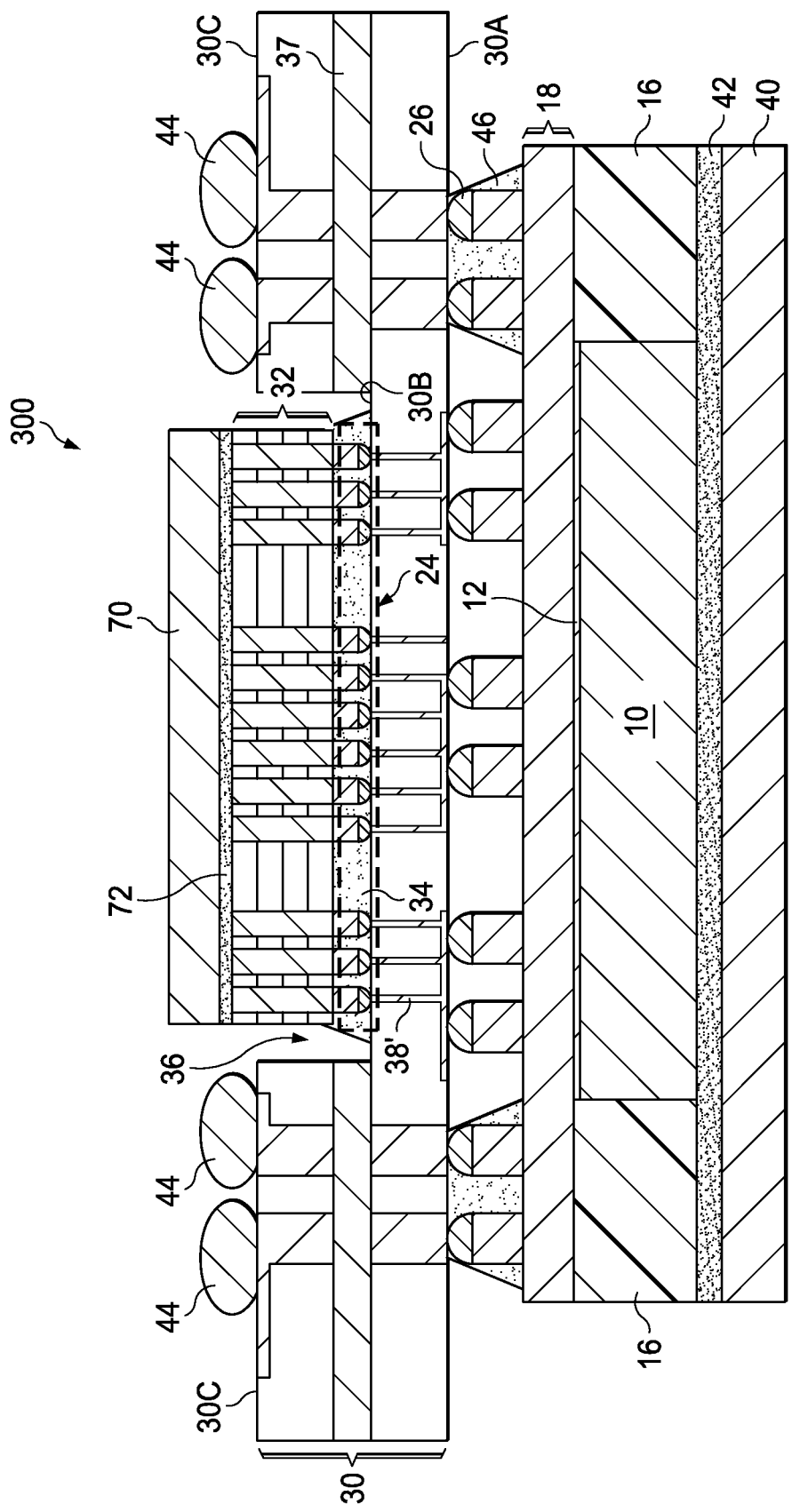

Subsequently, functional tests may be performed on package 300 prior to the attachment of dies 32. For example, electrical connections between die 10 and package substrate 30 may be tested. If package 300 passes the tests, dies 32 may be attached to package 300, for example, using connectors 24 formed as illustrated by FIG. 3D. Connectors 24 may be formed on dies 32 using any suitable method prior to attaching dies 32 to package 300. By performing functional tests on package 300 prior to the attachment of dies 32, dies 32 may be attached to only to known good packages. Packages that fail the functional tests may not have dies 32 attached thereto. Thus, cost savings may be incurred by avoiding attachment of dies 32 to failed packages.

Connectors 24 (e.g., microbumps) may be formed on dies 32 using any suitable method. Connectors 24 may be of a different size than connectors 26, and connectors 24 may be attached to contact pads on package substrate 30. Connectors 24 may be electrically connect dies 32 to die 10 through interconnect structures 38 in package substrate 30 (e.g., interconnect structures 38'), connectors 26, and RDLs 18.

Dies 32 may be disposed in cavity 36 of package substrate. In package 300, dies 32 and die 10 may be disposed on opposing sides of package substrate 30. Attaching dies 32 may include flipping package 300 (e.g., so that connectors 24 face upwards) and aligning dies 32 in cavity 36. A reflow may be performed on connectors 24 (e.g., to electrically connect dies 32 to die 10/package substrate 30), an underfill 34 may be dispensed around connectors 24.

The configuration of package 300 allows for a heat dissipation feature (e.g., heat dissipation feature 70) to be disposed on a surface dies 32. An interfacing material 72 may be disposed between heat dissipation feature 70 and dies 32, and interfacing material 72 may be in physical contact with dies 32. Heat dissipation feature 70 and interfacing material 72 may be substantially similar to heat dissipation feature 40 and interfacing material 42, respectively. Thus, an alternative manufacturing process may be used to form package 300.

Figure 5A:
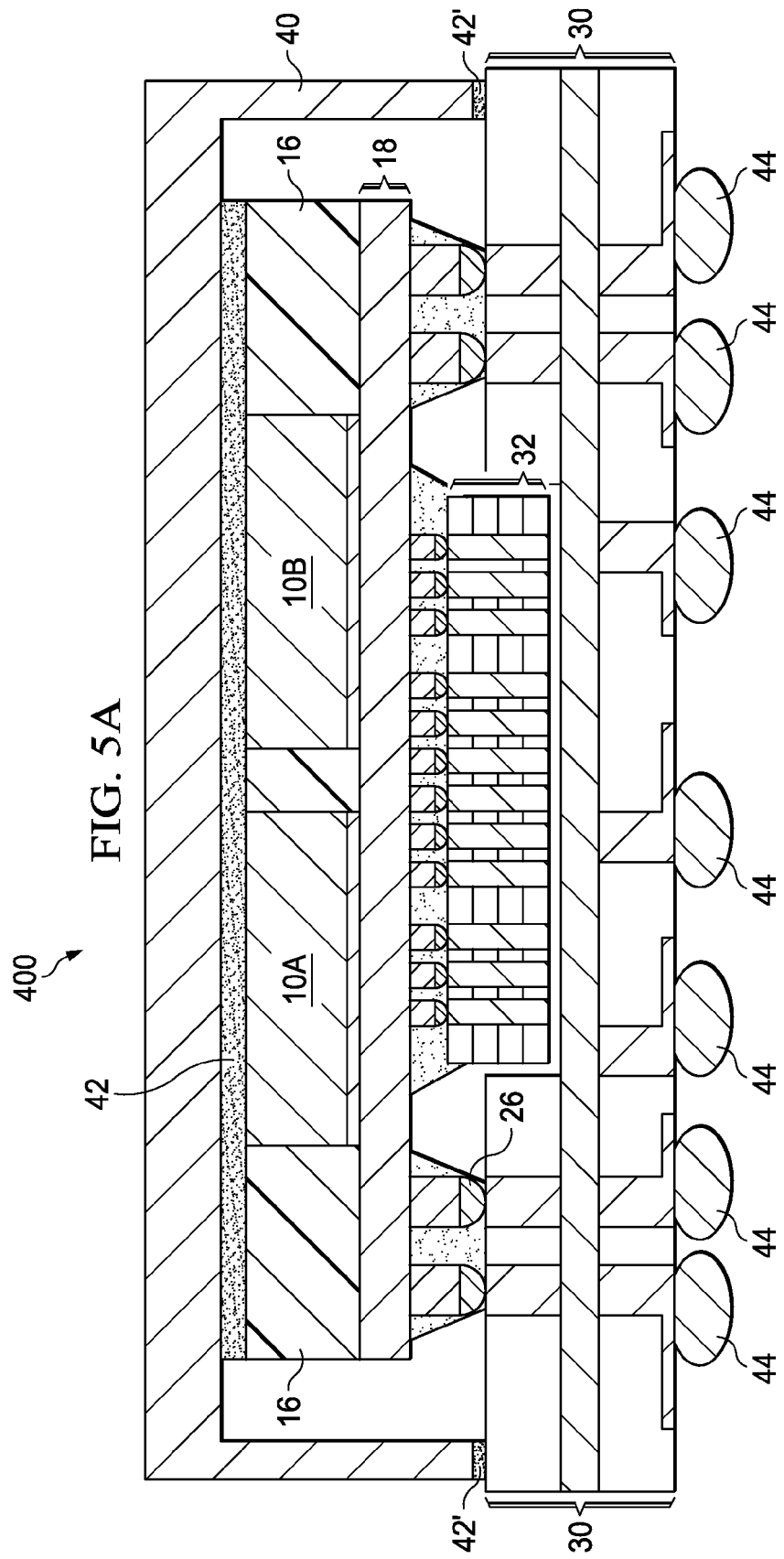
FIGS. 5A and 5B illustrate cross-sectional views of semiconductor packages in accordance with some alternative embodiments.
Figure 5B:
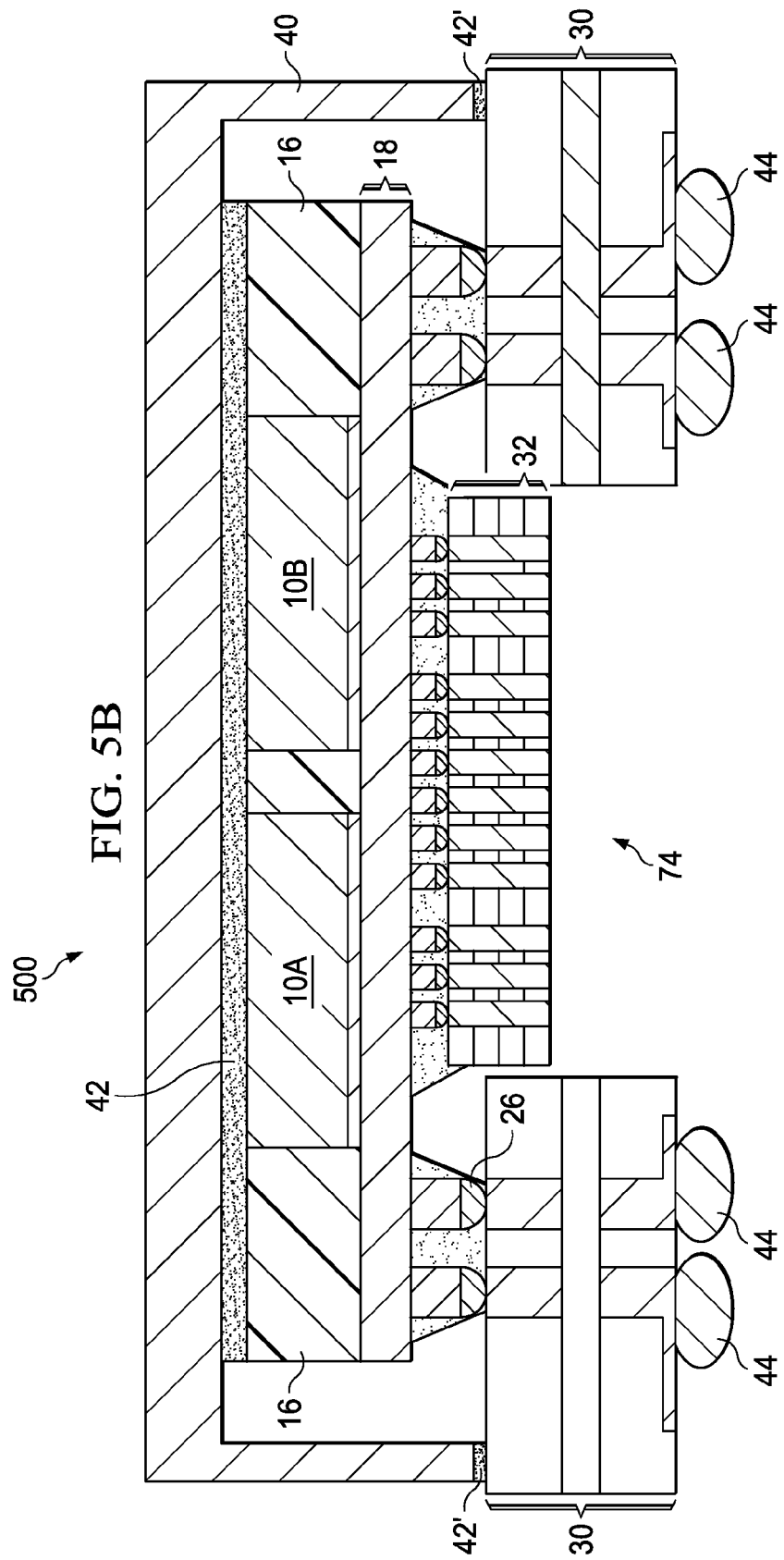

FIGS. 5A and 5B illustrate cross-sectional views of semiconductor packages 400 and 500, respectively. Packages 400 and 500 may be substantially similar to package 100 where like reference numerals represent like elements. However, packages 400 and 500 may further include multiple dies 10 (labeled 10A and 10B). Dies 10A and 10B may be part of a same fan-out package. For example, dies 10A and 10B may be surrounded by molding compound 14, and RDLs 18 may be formed on a surface of dies 10A and 10B. RDLs 18 may electrically connect dies 10A and 10B to dies 32. Furthermore, dies 10A and 10B may be substantially level. The formation of dies 10A and 10B may be substantially similar to the process illustrated in FIGS. 1A through 1J although singulation may be performed at different locations (e.g., scribe lines for a pick and place tool may be configured at different locations). In some embodiments, die 32 may be disposed in a cavity formed in substrate 30 (as illustrated by FIG. 5A). In other embodiments, die 32 may be disposed in a through-hole 74 in substrate 30 (as illustrated by FIG. 5B). Through hole 74 may be formed in substrate 30, for example, using a laser drilling process.

Figure 6A:
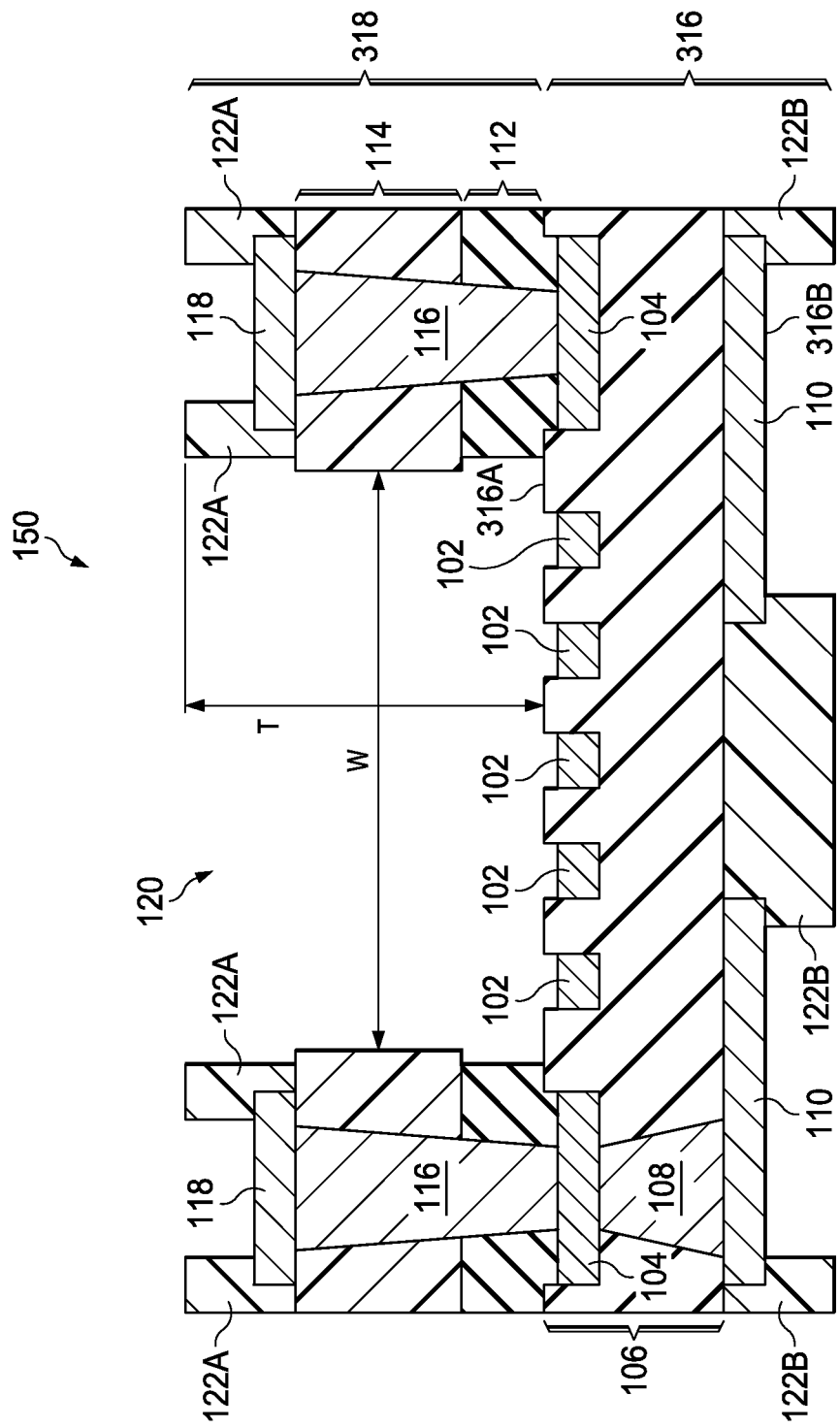
FIGS. 6A and 6B illustrate cross-sectional and top down views of a package substrate in accordance with some alternative embodiments.
Figure 6B:
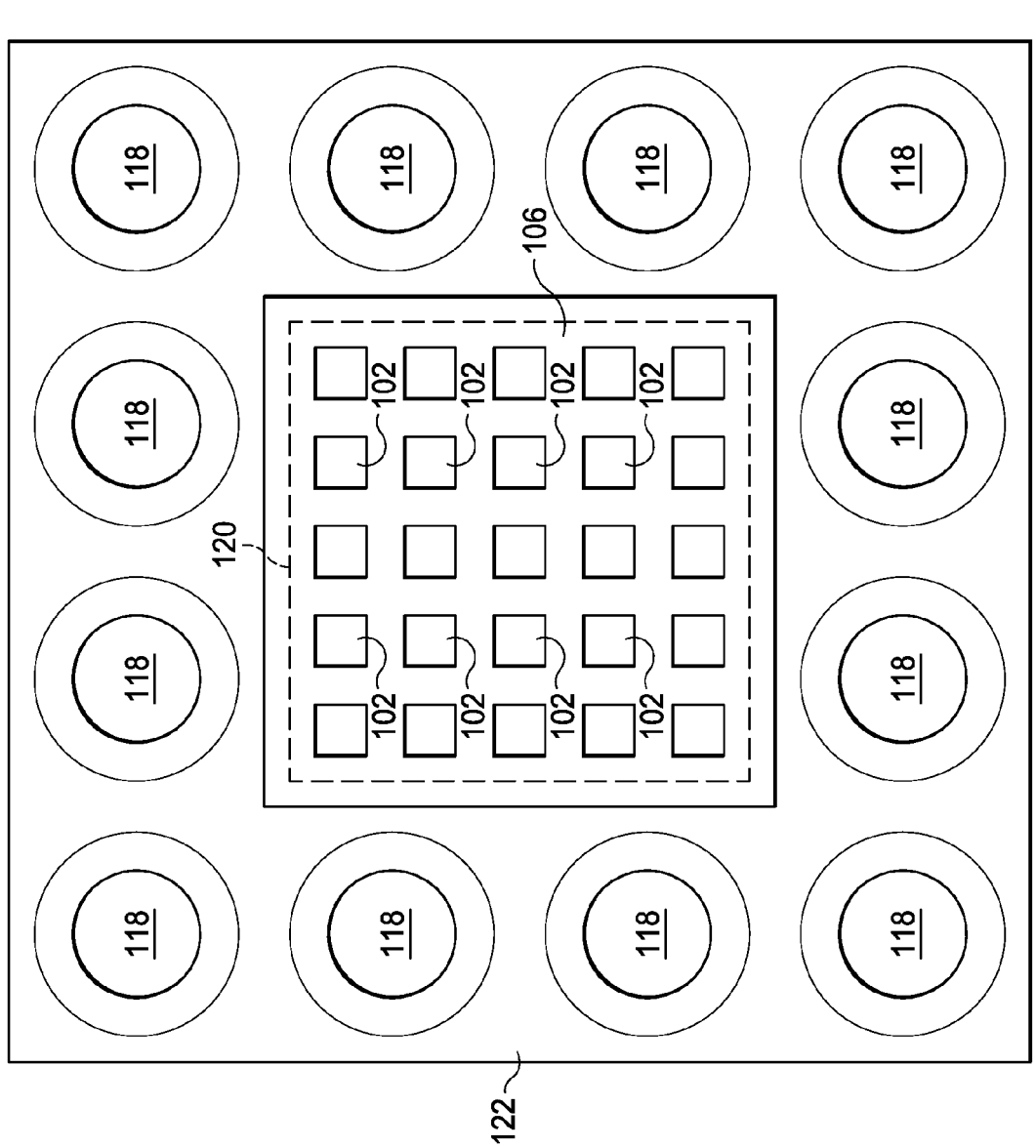

FIGS. 6A and 6B illustrate cross-sectional and top down views of a package substrate 150 in accordance with some alternative embodiments. FIG. 6A illustrates a cross-sectional view while FIG. 6B illustrates a top down view. Package substrate 150 includes a coreless build-up portion 316 and a laminate portion 318 over the coreless build-up portion 316. In various embodiments, coreless build-up portion 316 has thin profile (e.g., due to the lack of a core), which may be integrated in advanced node applications for achieving a thin overall package profile.

Coreless build-up portion 316 includes one or more embedded pattern process (EPP) layers, such as one or more build-up layers 106 (e.g., dielectric layers) comprising conductive features 102, 104, and 108. Conductive features 102 may be at least partially exposed at a top surface 316A of coreless build-up portion 316, and exposed portions of conductive features 102 may be used as bump pads to bond a die (e.g., die 202 in FIG. 7A) to package substrate 150. In some embodiments, conductive features 102 may have a pitch of about 40 μm to about 150 μm for fine pitch bonding. Other dimensions for conductive features 102 may also be employed in other embodiments depending on substrate design.

Furthermore, conductive features 102 may be electrically connected to conductive features 104. For example, one or more interconnect layers (not illustrated) having conductive interconnect structures (e.g., conductive lines and/or vias) electrically connecting conductive features 102 and 104 may be formed in coreless build-up portion 316. Alternatively, conductive features 102 may be conductive trace lines, which may be physically connected to conductive features 104. Conductive features 104 may be electrically connected to vias 108, which may be used to provide electrical connection to contact pads 110 on a bottom surface 316B of coreless build-up portion 316. For example, in the illustrated embodiment, vias 108 extend through dielectric layer 106. A solder resist 122B may be disposed on bottom surface 316B of coreless build-up portion 316, and openings in solder resist 122B may expose contact pads 110. Subsequently, external connectors (e.g., ball grid array (BGA) balls, see FIG. 7A) may be disposed on contact pads 110.

Laminate portion 318 may be disposed over coreless build-up portion 316. In various embodiments, laminate portion 318 includes vias 116 extending through a dielectric layer 112 and core 114. Dielectric layer 112 may be used to bond core 114 to coreless build-up portion 316. Laminate portion 318 further includes a cavity 120, where a die (e.g., die 202 in FIG. 7A) bonded to conductive features 102 may be disposed. In some embodiments, cavity 120 may have a lateral dimension W greater than about 30 μm, and a vertical dimension T greater than about 30 μm.

Laminate portion 318 further includes contact pads 118, which may be used to bond another package feature such as another device die, another device package (e.g., package 204 of FIG. 7A), and the like. In some embodiments, contact pads 118 may have a pitch of about 200 μm to about 400 μm for fine pitch bonding. Other dimensions for contact pads 118 may also be employed depending on package design. As illustrated in a top-down view of package substrate 150 of FIG. 6B, contact pads 118 (and the other underlying features of laminate portion 318) may encircle cavity 120 and exposed conductive features 102.

Vias 116 are electrically connected to conductive features 104, and the dimension of vias 116 may be selected to provide a sufficient stand-off height (e.g., vertical dimension T) so that die 202 may be disposed in cavity 120. The use of vias 116 and contact pads 118 may be used in lieu of traditional large, solder balls for bonding another device package, which reduces the risk of solder bridging and improves yield. Furthermore, core 114 of laminate portion 318 may provide improved rigidity for warpage control in package substrate 150. A solder resist 122A may be disposed over core 114, and openings may be patterned in solder resist 122 to expose contact pads 118.

Figure 7A:
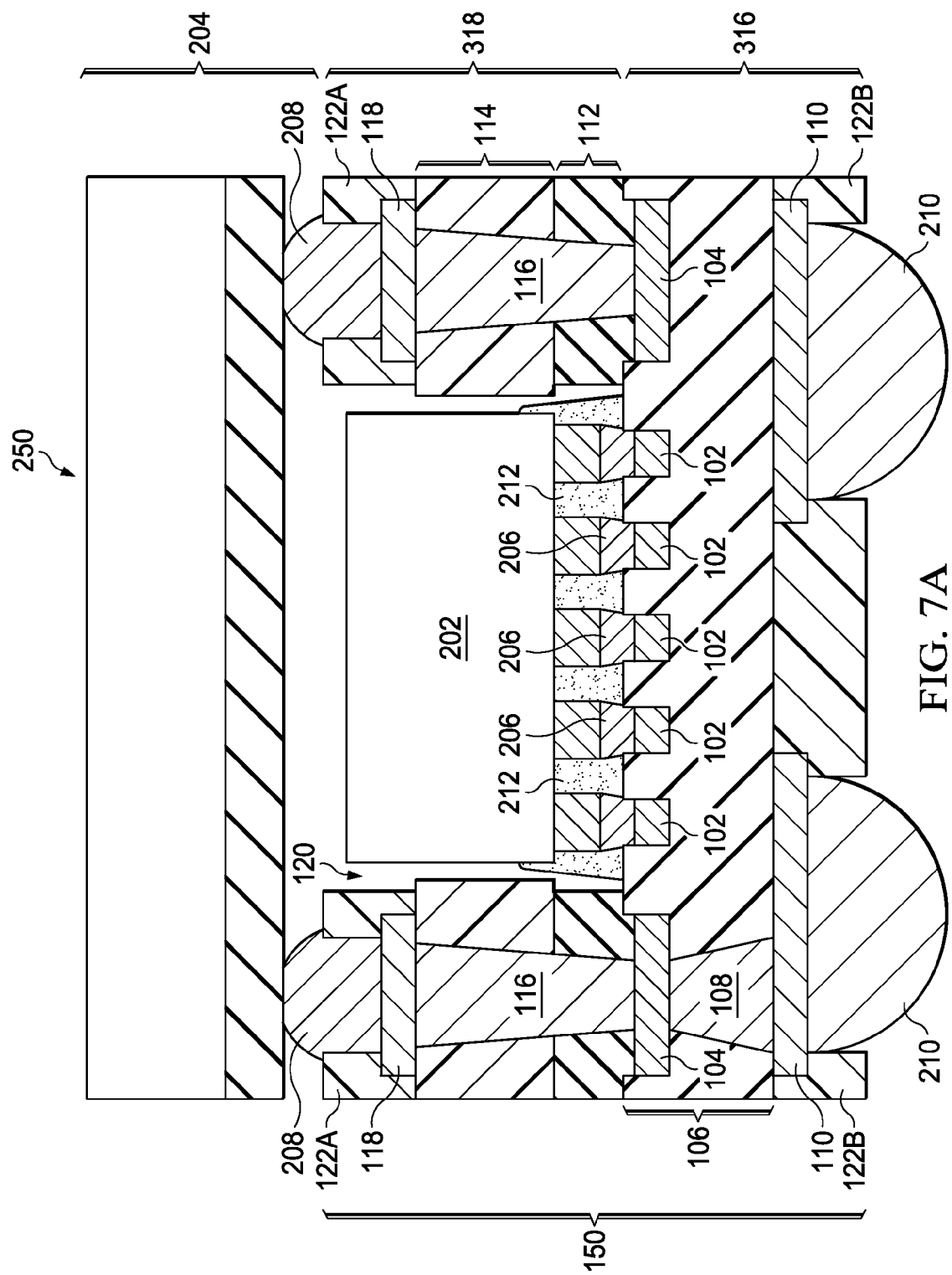
FIGS. 7A and 7B illustrate cross-sectional views of a device package incorporating a package substrate in accordance with some alternative embodiments.
Figure 7B:
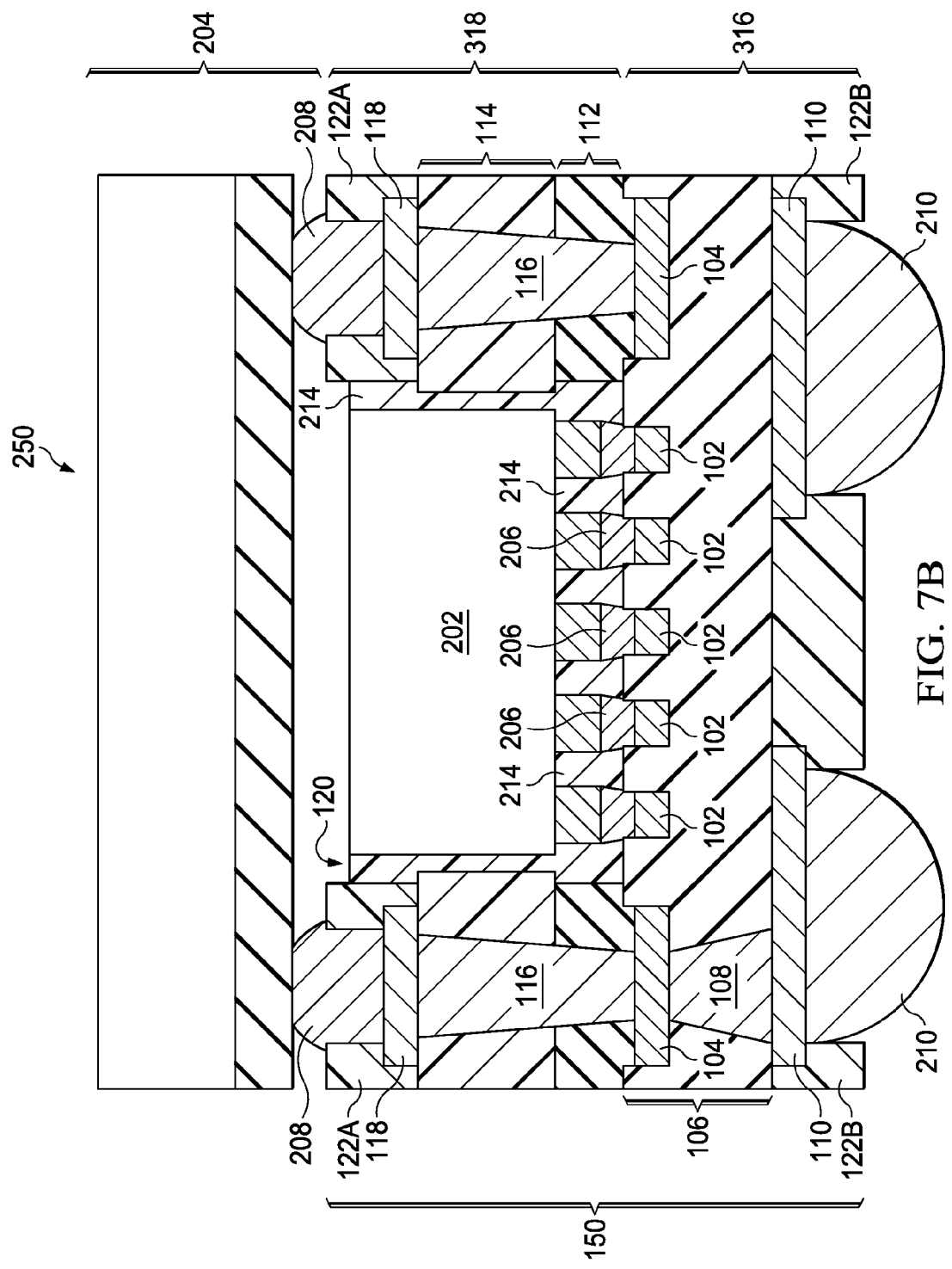

FIGS. 7A and 7B illustrate cross-sectional views of a package 250 having a package substrate 150 as illustrated in FIGS. 6A and 6B. A die 202 may be disposed in cavity 120 and bonded to exposed conductive features 102 through connectors 206 (e.g., BGA balls, microbumps, C4 bumps, and the like). In some embodiments (as illustrated by FIG. 7A), an underfill 212 may be dispensed around connectors 206. In other embodiments (as illustrated by FIG. 7B), a molding compound 214 may be dispensed around die 202 and at least partially fill cavity 120. Die 202 may be exposed by molding compound 214 (as illustrated by FIG. 7B) or molding compound 214 may cover die 202 (not shown).

Furthermore, another device package 204 may be bonded to contact pads 118 by connectors 208 (e.g., BGA balls, microbumps, C4 bumps, and the like). Device package 204 may include various features (not individually illustrated), such as one or more device dies, which may or may not be configured in a die stack, and interconnect structures (e.g., various fan-out RDLs, through-vias, package substrates, interposers, and the like). In some embodiments, package 204 may be a memory package such as a dynamic random access memory (DRAM) package, and the like. In the illustrated embodiments, laminate portion 318 of package substrate 150 provides a sufficient standoff height so that die 202 may be disposed in cavity 120 without contacting package 204. External connectors 210 may be disposed on contact pads 110 on a bottom surface 316B of coreless build-up portion 316. External connectors 210 may be used to bond package 250 to another package component such as an interposer, package substrate, printed circuit board, and the like.

Figure 8C:
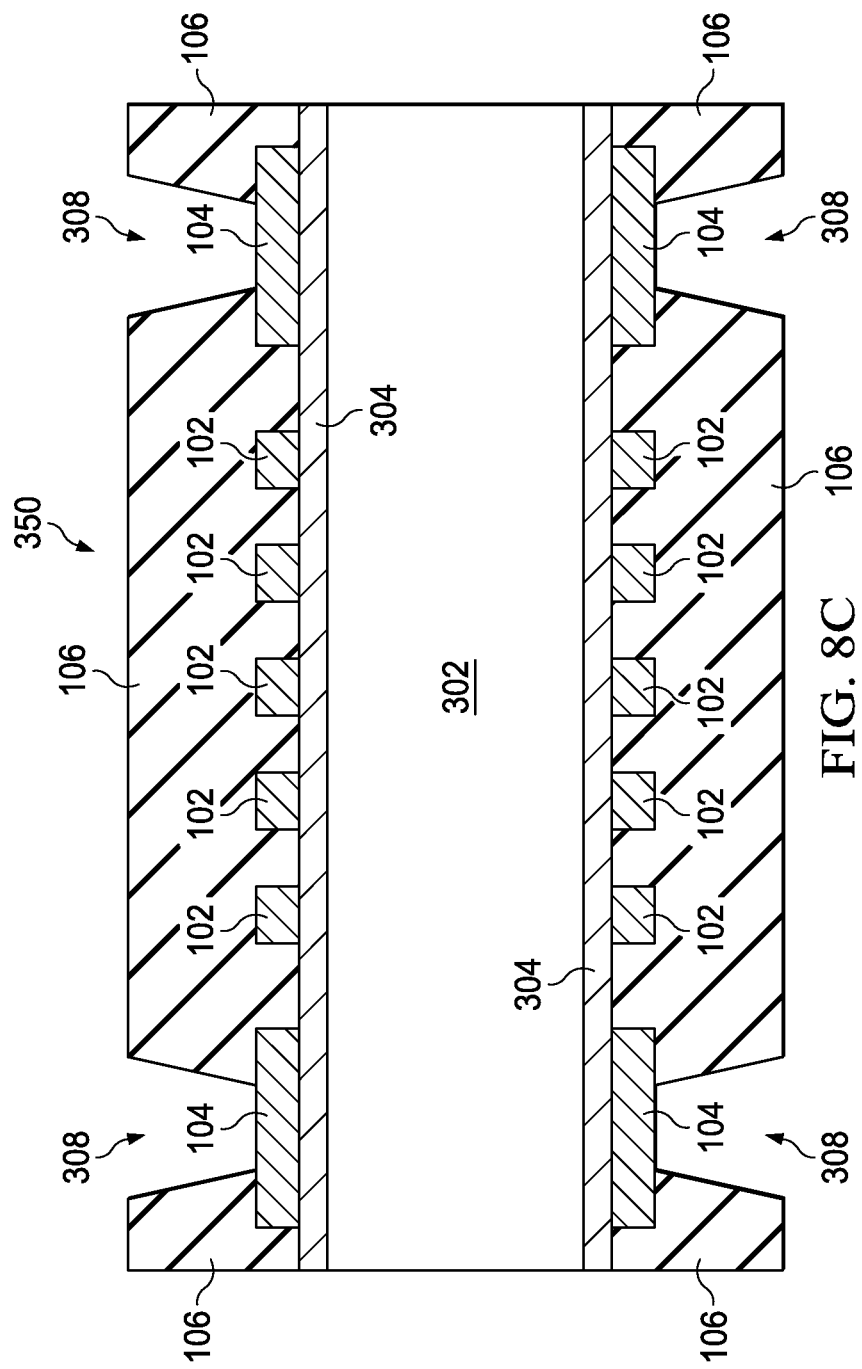
FIGS. 8A through 8N illustrate varying views of various intermediary stages of manufacturing a package substrate in accordance with some alternative embodiments.
Figure 8D:
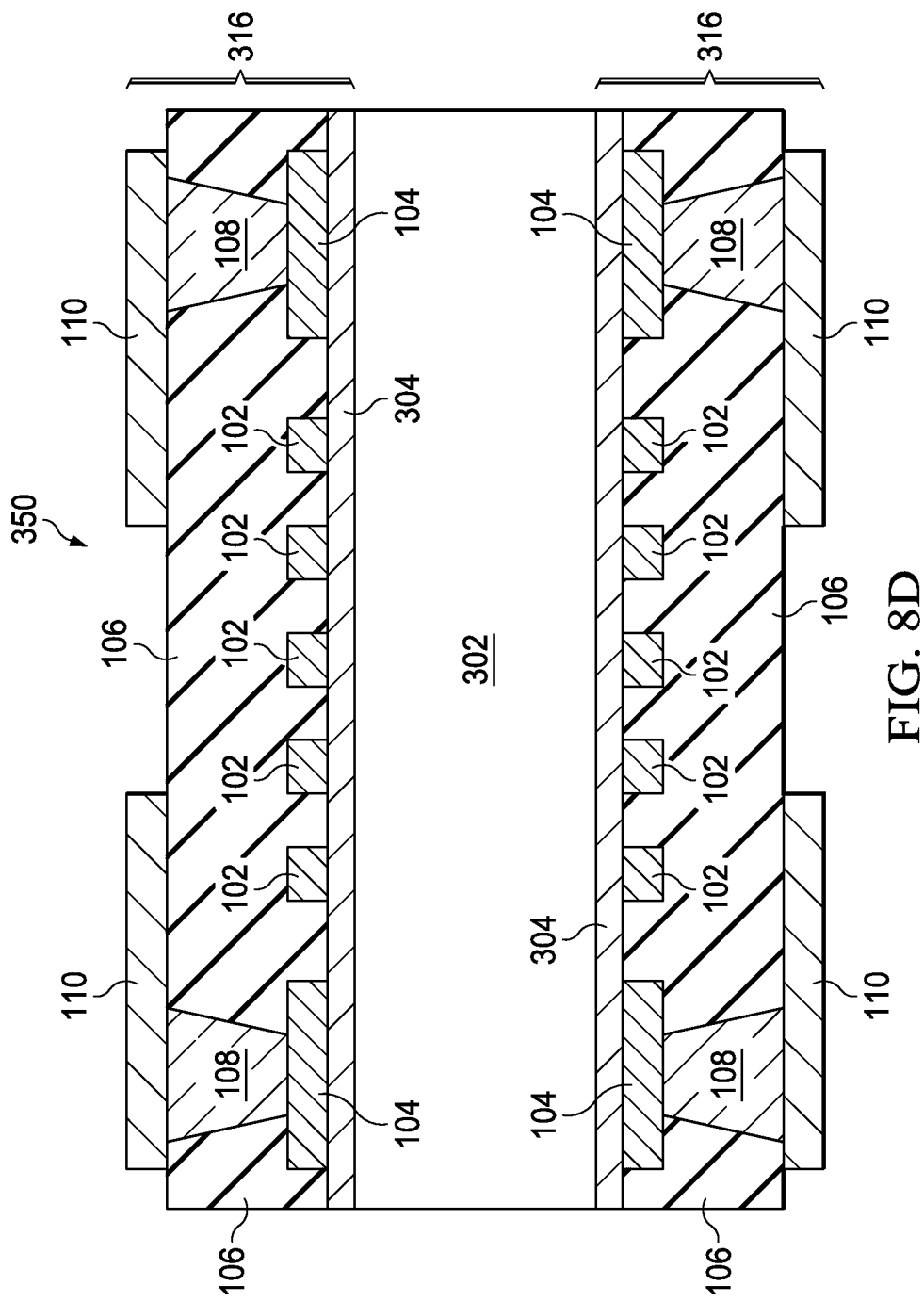
Figure 8E:
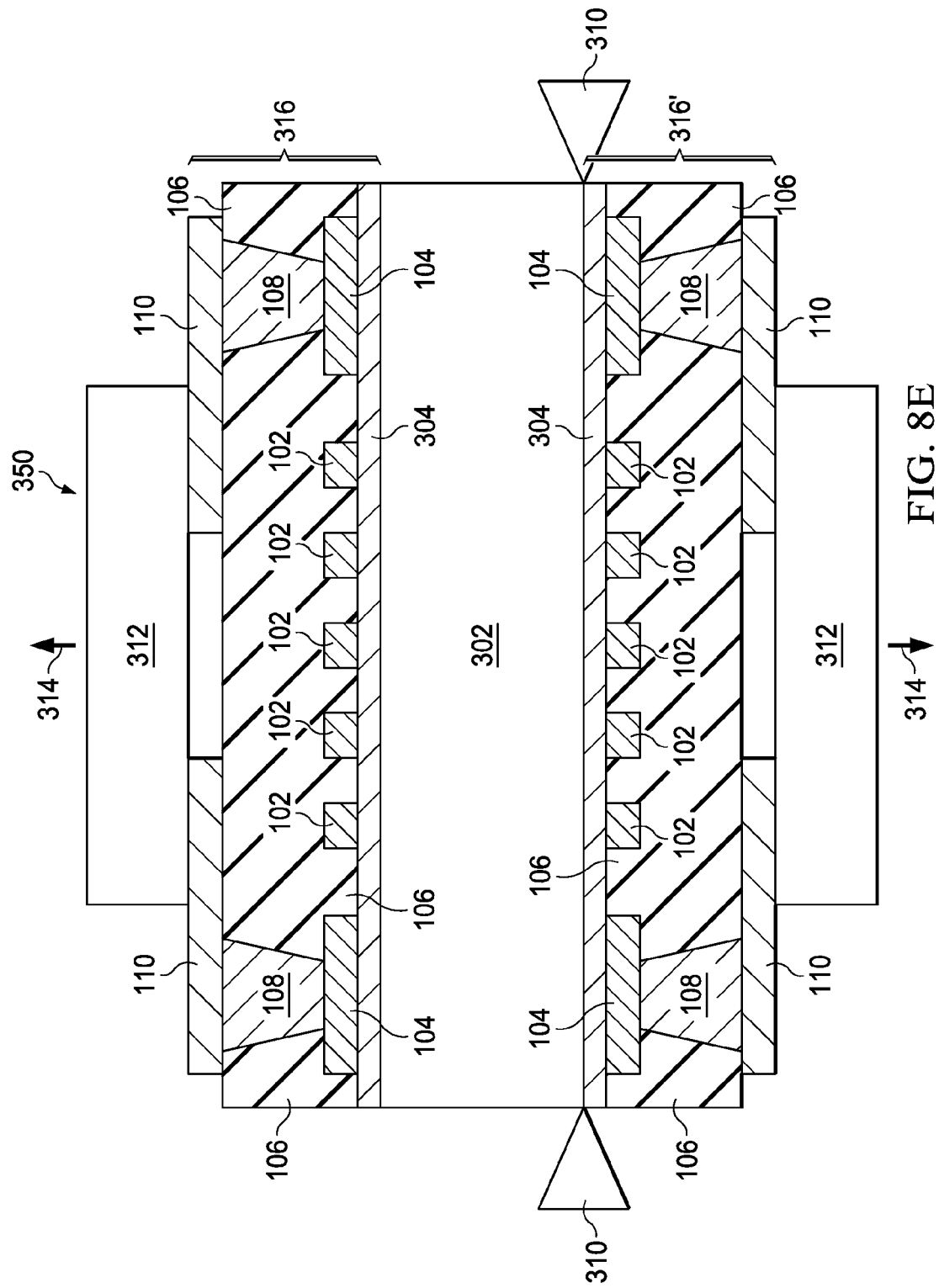
Figure 8F:
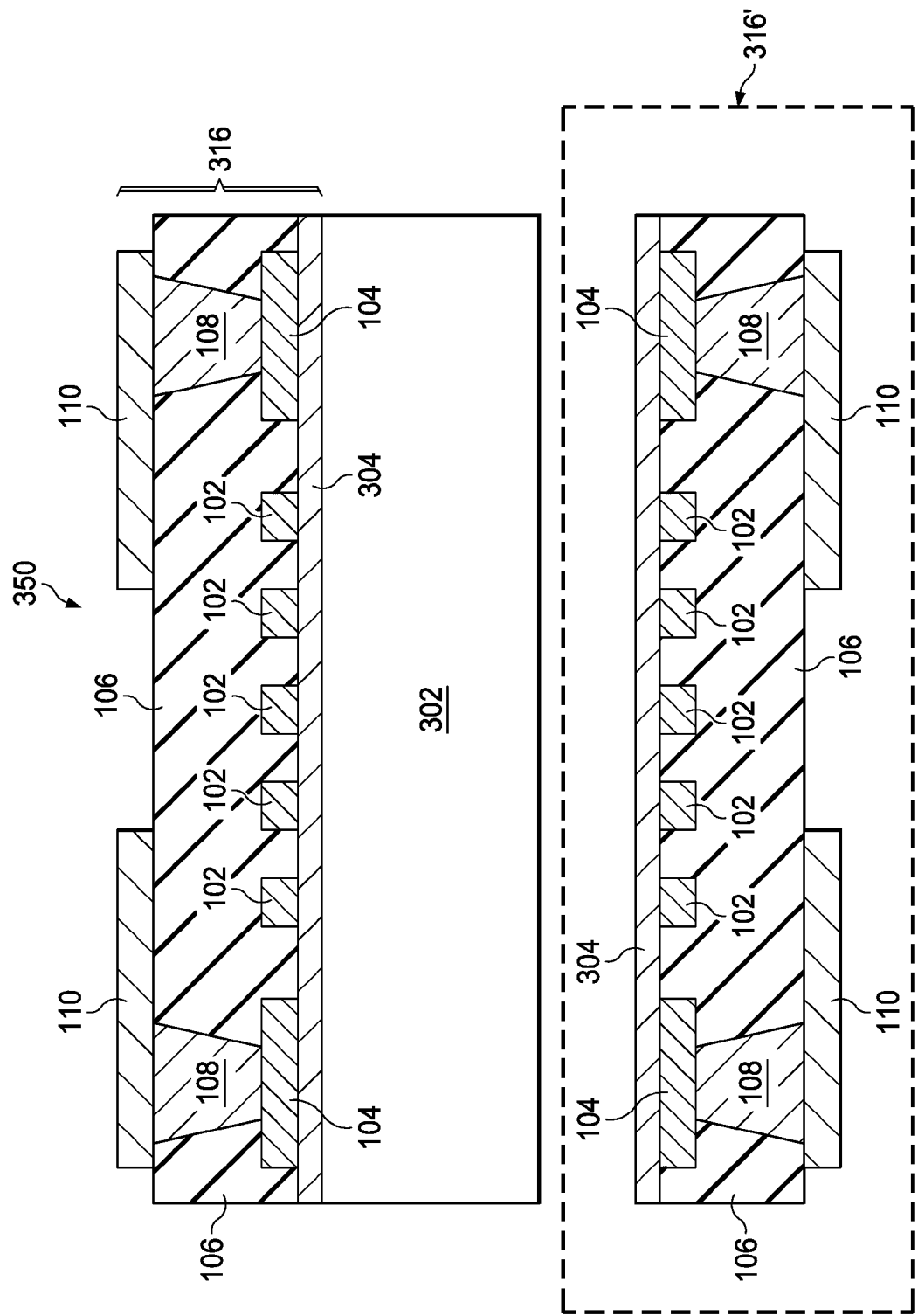
Figure 8G:
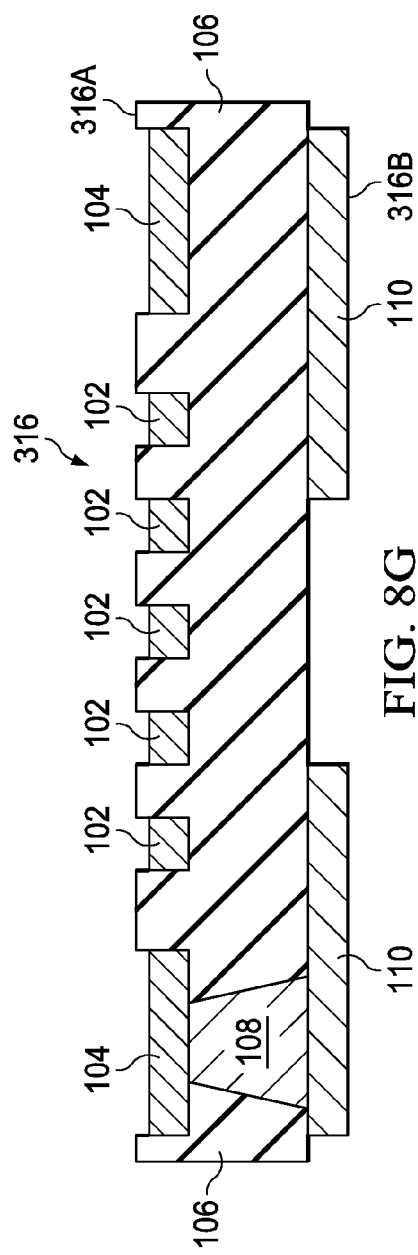
Figure 8H:
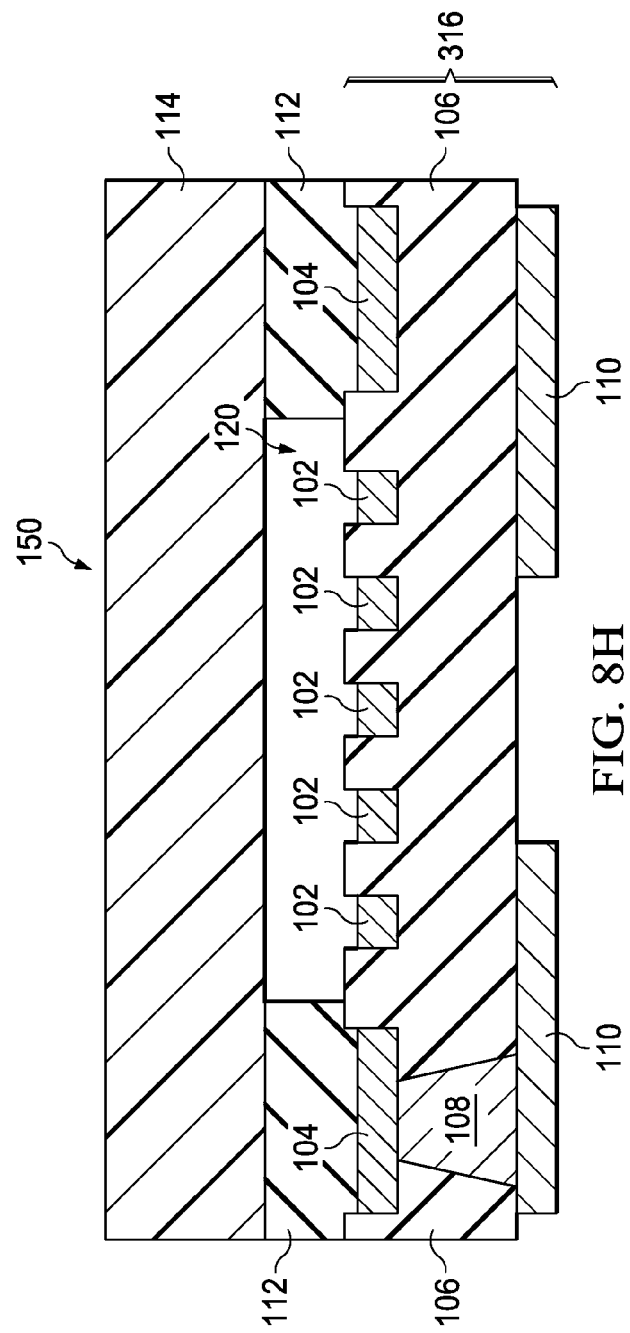
Figure 8I:
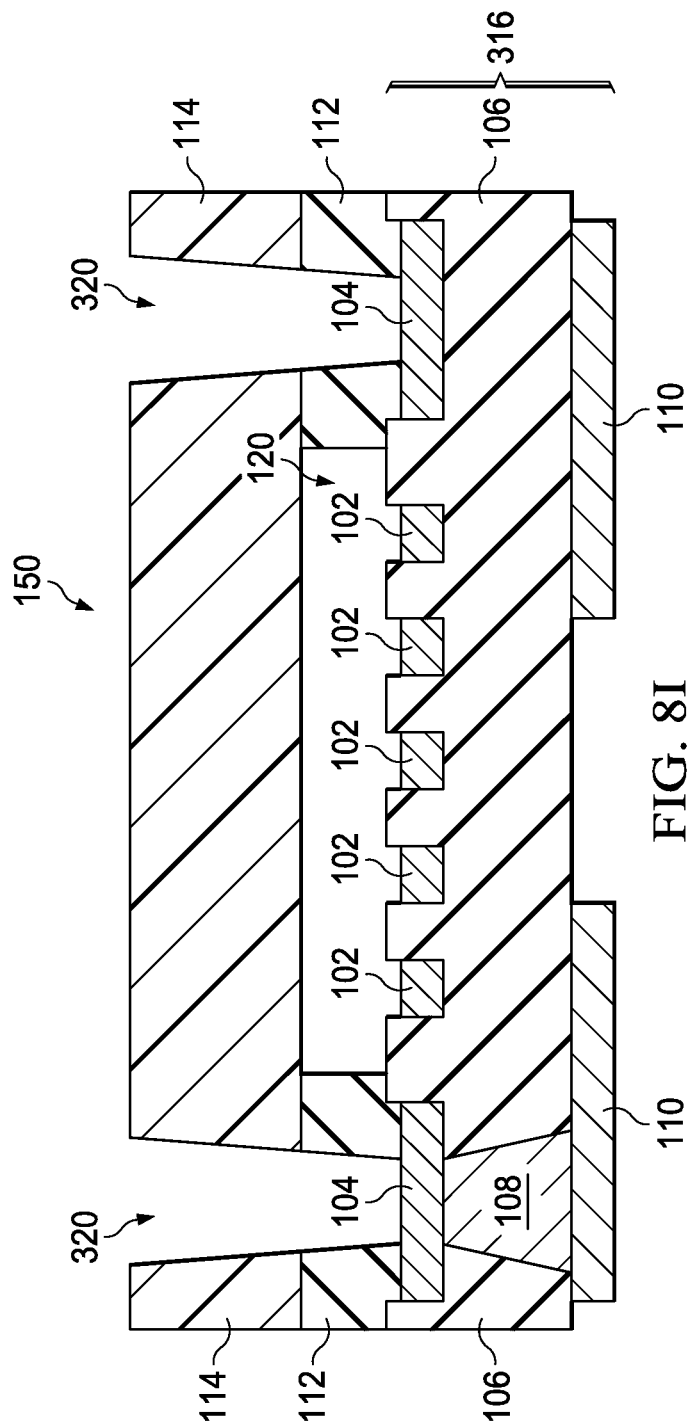
Figure 8J:
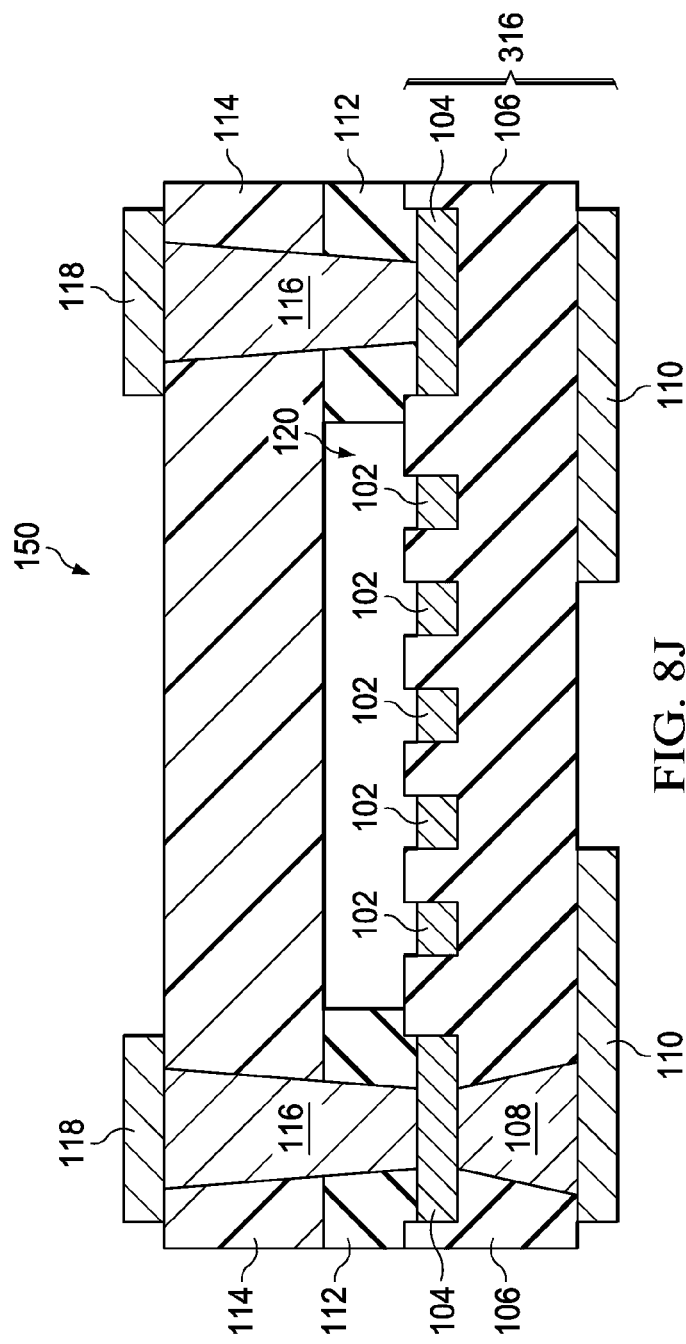
Figure 8K:
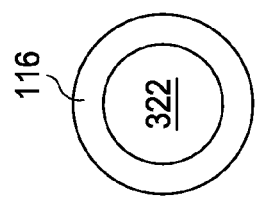
Figure 8L:
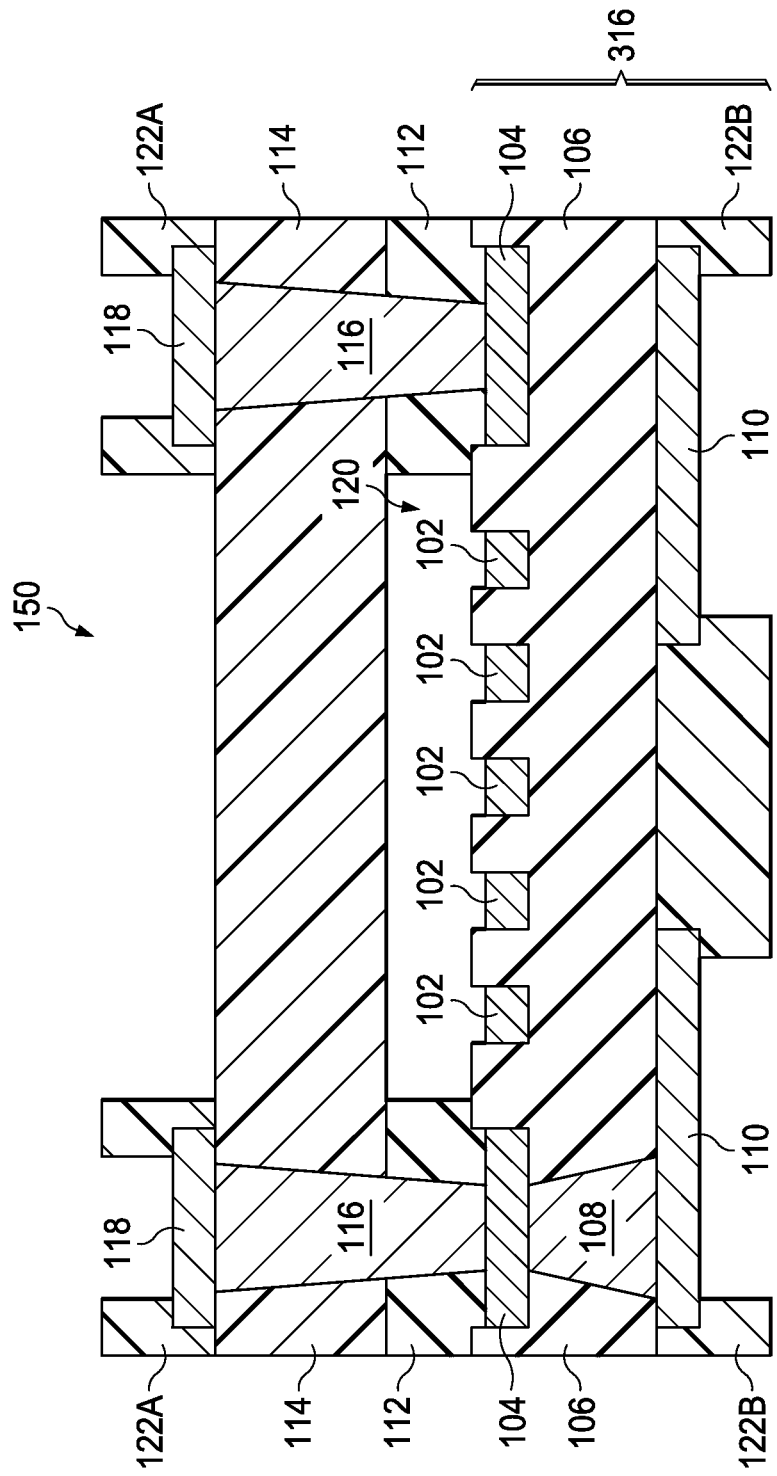
Figure 8M:
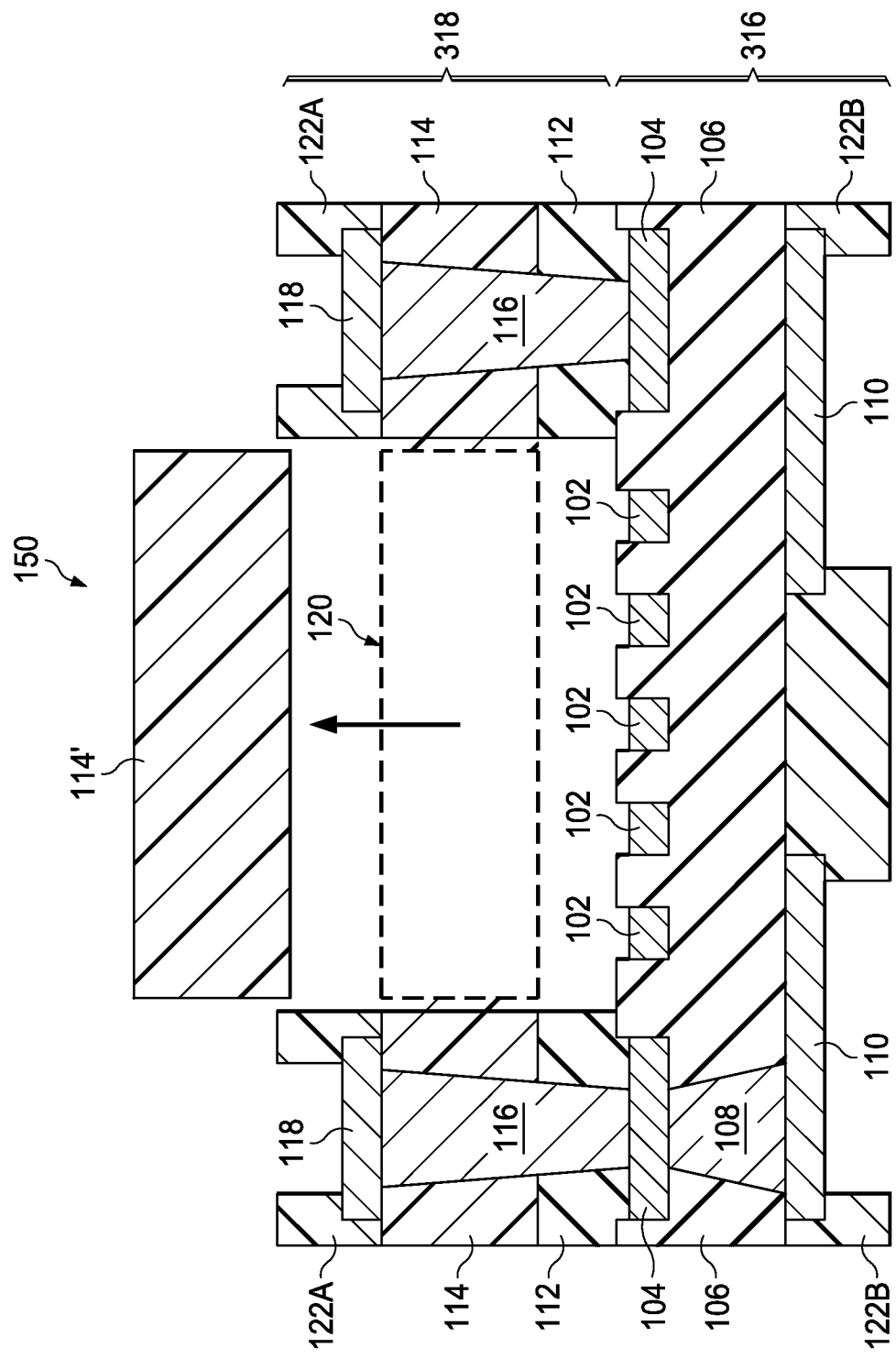
Figure 8N:
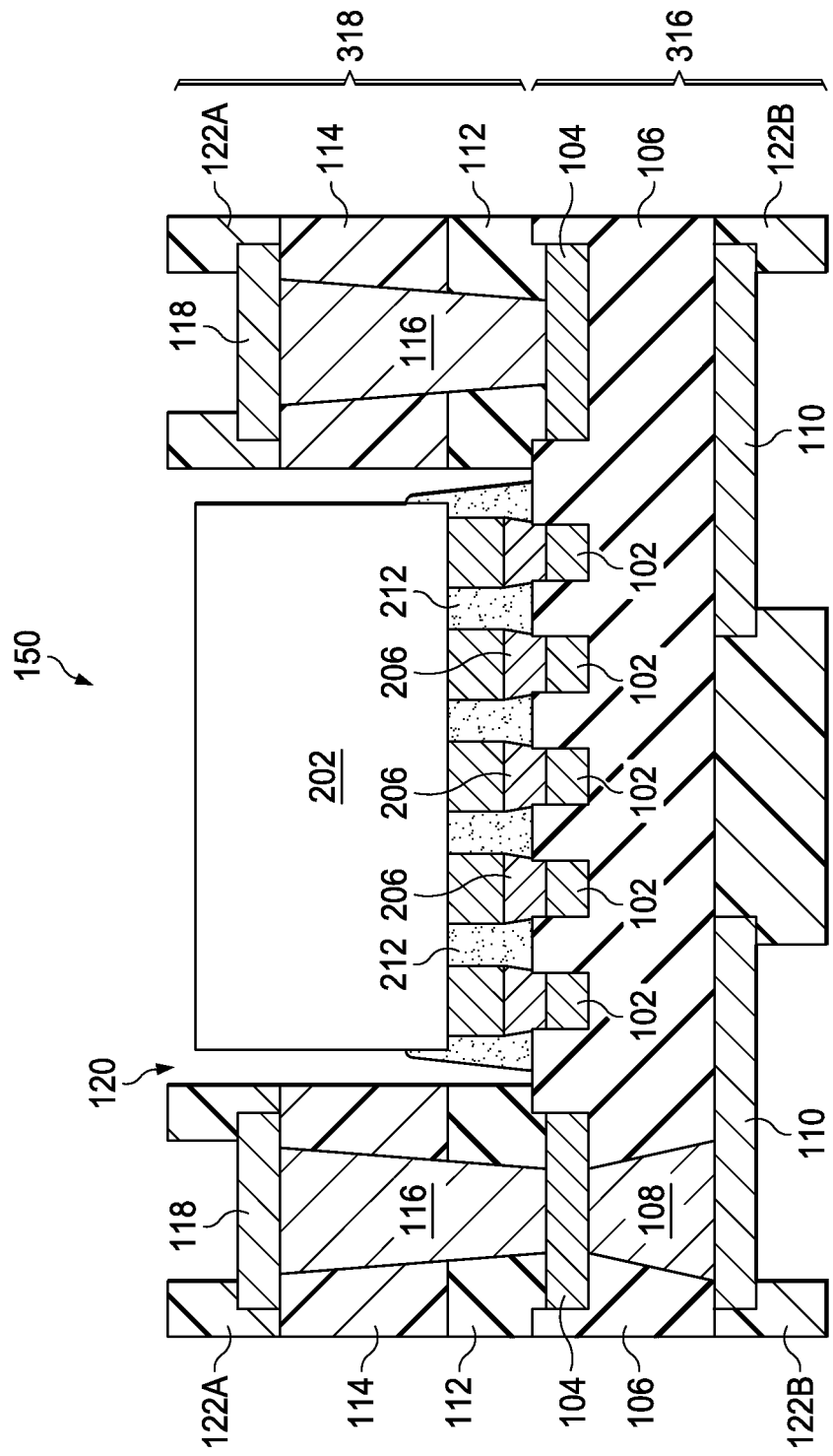

FIGS. 8A through 8N illustrates cross-sectional views of various intermediary steps of manufacturing a package substrate 150 in accordance with some embodiments. The manufacturing of substrate 150 may be divided into two logical stages. In the first stage (as illustrated by FIGS. 8A through 8G), a coreless build-up portion 316 is formed using a carrier 302 for temporary structural support. Subsequently, in the second stage (as illustrated by FIGS. 8H through 8M), laminate portion 318 having a cavity 120 is formed over coreless build-up portion 316.

Referring now to FIG. 8A, a carrier substrate 302 having seed layers 304 disposed on opposing surfaces is provided. Carrier substrate 302 provides temporary mechanical and structural support for the processing of build-up layers during subsequent processing steps. In some embodiments, carrier 302 may comprise an organic core material such as epoxy-impregnated glass-fiber laminate, polymer-impregnated glass-fiber laminate, and the like. Alternatively, carrier 302 may comprise other materials, such as, stainless steel, glass, and the like.

Seed layers 304 comprising a conductive material (e.g., copper) are formed on opposing surfaces of carrier 302. Seed layers 304 are formed using any suitable process. For example, when carrier 302 comprises an organic core material, seed layers 304 may be formed by laminating a conductive foil (e.g., copper foil) on opposing sides of carrier 302. As another example, seed layers 304 may be formed using plating or sputtering processes when carrier 302 comprises stainless steel, glass, and the like.

As further illustrated by FIG. 8A, patterned photoresists 306 are formed on seed layers 304 (e.g., a patterned photoresist 306 is formed on both sides of carrier 302). For example, photoresists 306 may be coated or laminated as blanket layers on respective seed layers 304. Next, portions of photoresists 306 are exposed using a photo mask (not shown). Exposed or unexposed portions of photoresists 306 are then removed depending on whether a negative or positive resist is used. The resulting patterned photoresists 306 may include openings 308, exposing respective seed layers 304.

FIG. 8B illustrates the filling of openings 308 with a conductive material such as copper, silver, gold, and the like to form conductive features 102 and 104. Conductive features 102 and 104 may vary in dimension depending on substrate design. For example, conductive features 102 may be used as bump pads for bonding a device die 202 in subsequent process steps (see e.g., FIG. 3N) while conductive features 104 may be used as contacts for the formation of through-vias (e.g., through vias 116 of FIG. 3I) in subsequent process steps. Thus, conductive features 102 may have a smaller pitch and/or width compared to conductive features 104.

The filling of openings 308 may include plating openings 308 (e.g., electro-chemical plating) with the conductive material using seed layers 304. The conductive material may overfill openings 308, and a planarization may be performed to remove excess portions of the conductive material over photoresists 306. Planarization may include a chemical mechanical polish (CMP) process, mechanical grinding process, or other etch back technique, for example. Subsequently, a plasma ashing and/or wet strip process may be used to remove photoresists 306. Optionally, the plasma ashing process may be followed by a wet dip in a sulfuric acid ($H_2SO_4$) solution to clean the structure and remove remaining photoresist material.

Next, as illustrated by FIG. 8C, build-up layers 106 are formed on both sides of carrier 302. For example, each build-up layer 106 may be disposed over a corresponding seed layer 304 and conductive features 102/104. Build-up layers 106 may comprise a dielectric material such as a prepreg (e.g., FR4 epoxy resin, M6 epoxy resin, and the like), Ajinomoto build-up film (ABF), and the like, which may be applied by lamination. For example, a vacuum laminator may be used to dispose dielectric material on carrier 302, and an oven curing process may be applied to adhere the dielectric material to seed layers 304 and conductive features 102/104. As another example, a hot press process may apply the dielectric material to seed layers 304 and conductive features 102/104 under suitable heat and/or pressure conditions for a suitable duration (e.g., one to two hours) to form build-up layers 106.

Alternatively, or additionally, build-up layers 106 may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. Build-up layers 106 may be formed by sputtering, spin-on coating, CVD, low-pressure CVD, rapid thermal CVD, atomic layer CVD, and/or plasma enhanced CVD, perhaps utilizing tetraethyl orthosilicate and oxygen as a precursor. Build-up layers 106 may also be formed by an oxidation process, such as wet or dry thermal oxidation in an ambient environment comprising an oxide, water, nitric oxide, or a combination thereof, and/or other processes.

As further illustrated by FIG. 8C, build-up layers 106 may be patterned to include openings 308 exposing conductive features 104. The patterning of build-up layers 106 may include any suitable process such as laser drilling, a combination of photolithography and etching, and the like.

FIG. 8D illustrates the formation of additional conductive features, such as conductive vias 108 and contact pads 110. Conductive vias 108 may be formed by filling openings 308 with a conductive material. In an embodiment, the conductive material may be formed by depositing a seed layer on sidewalls of openings 308. The seed layer (not shown) may be formed of copper, nickel, gold, any combination thereof and/or the like. Once the seed layer has been deposited in the opening, a conductive material, such as tungsten, titanium, aluminum, copper, any combinations thereof and/or the like, is filled into the opening, using, for example, an electrochemical plating process. The conductive material may overfill openings 308, and excess materials (e.g., excess conductive materials) are removed from surfaces of build-up layers 106. In some embodiments a planarization process, such as a CMP process, mechanical grinding process, or other etch-back technique is used to remove the excess materials, thereby forming vias 108.

Contact pads 110 may also be formed on build-up layers 106. Contact pads 110 may be formed using a substantially similar process as conductive features 102/104. For example, a patterned photoresist (not shown) may be formed over build-up layers 106. Openings in the patterned photoresist may be used to define a shape of contact pads 110. Such openings may be filled with a conductive material, for example, by first depositing a seed layer (not shown) on bottom surfaces and/or sidewalls of such openings and filling the openings using an electro-chemical plating process. Contact pads 110 may be electrically connected to contacts 104 by vias 108, and external connectors (e.g., solder balls) may be disposed on contact pads 110 (see e.g., FIG. 2B). Thus, two coreless build-up layer portions 316 are formed on both sides of carrier 302. Although each build-up layer portion 316 only contains a single build-up layer 106, in alternative embodiments, any number of build-up layers having conductive features (e.g., conductive lines and/or vias) may be formed depending on substrate design. Furthermore, although FIGS. 8A through 8D illustrate the simultaneous formation of two build-up layer portions 316 on carrier 302, in alternative embodiments, a single coreless build-up layer portion 316 may be formed on a single side of carrier 302.

FIGS. 8E and 8F illustrate the removal of a build-up layer portion 316 (labeled 316') from carrier 302. In some embodiments, build-up layer portion 316' is removed using mechanical force. For example, referring to FIG. 8E, mechanical tools 310 are wedged between carrier 302 and a seed layer 304. Mechanical tools 310 create a separation between carrier 302 and seed layer 304 at edge portions of carrier 302. Next, vacuum clamps 312 may be used to apply mechanical force to opposing sides of carrier 302. Vacuum clamps 312 may apply mechanical force in opposing directions (as indicated by arrows 314), and the mechanical force physically separates build-up layer portion 316' from carrier 302. In some embodiments, build-up layer portion 316' may be separated from carrier 302 without significantly damaging other features in the illustrated structure due the relatively weak adhesive bond between carrier 302 and seed layer 304. For example, seed layer 304 may be applied to carrier 302 using a relatively weak lamination process (e.g., without undergoing an extensive cure). The weakness of the bond between carrier 302 and seed layer 304 may further be exploited by the separation of carrier 302 and seed layer 304 at edge portions due to the application of mechanical tools 310. Thus, build-up portion 316' may be removed from carrier 302 as illustrated by FIG. 8F. The build-up portion 316 above carrier 302 may also be removed using a similar process.

Referring next to FIG. 8G, seed layer 304 may be removed using a suitable etching process, for example. The etching of seed layer 304 may further recess conductive features 102 and 104 from a top surface of dielectric layer 106. In some embodiments, the etching of seed layer 304 may use a suitable chemical etchant depending on the material of seed layer 304. For example, when seed layer 304 comprises copper, suitable chemical etchants include a sulfuric acid ($H_2SO_4$) or hydrogen peroxide ($H_2O_2$) based chemical etchant. Thus, conductive features 102 and 104 may be exposed at a top surface 316A of coreless build-up portion 316.

FIGS. 8H through 8M illustrate various intermediary steps of forming laminate portion 318 over coreless build-up portion 316. First, referring to FIG. 8H, a core 114 may be bonded to coreless build-up portion 316 by a patterned dielectric layer 112. For example, an uncured dielectric layer 112 comprising a suitable material such as a prepreg (e.g., FR4 epoxy resin, M6 epoxy resin, and the like), ABF, and the like, which may be applied over coreless build-up portion 316. Dielectric layer 112 may be patterned to include a cavity 120, which may be aligned with exposed conductive features 102. In some embodiments, cavity 120 may be pre-patterned (e.g., using a punching process) in dielectric layer 112 prior to the disposition of dielectric layer 112 on coreless build-up portion 316. Other methods for patterning dielectric layer 112 (either before or after being disposed on coreless build-up portion 316) may also be employed. Next, core 114 may be disposed over dielectric layer 112, and a curing process may be applied to adhere core 114 to coreless build-up portion 316. Core 114 may comprise an organic core material such as epoxy-impregnated glass-fiber laminate, polymer-impregnated glass-fiber laminate, and the like, for example.

FIGS. 8I and 8J illustrate the formation of conductive features in dielectric layer 112 and core 114. First, in FIG. 8I, openings 320 may be patterned in core 114 and dielectric layer 112 using a laser drilling process, for example. Openings 320 may extend through core 114 and dielectric layer 112 to expose conductive features 104.

FIG. 8J illustrates the formation of additional conductive features, such as conductive vias 116 and contact pads 118. Conductive vias 118 may be formed by filling openings 320 with a conductive material. In an embodiment, the conductive material may be formed by depositing a seed layer on sidewalls of openings 320. The seed layer (not shown) may be formed of copper, nickel, gold, any combination thereof and/or the like. Once the seed layer has been deposited in the opening, a conductive material, such as tungsten, titanium, aluminum, copper, any combinations thereof and/or the like, is filled into the opening, using, for example, an electro-chemical plating process. In some embodiments, the conductive material may not completely fill openings 320. For example, FIG. 8K illustrates a top-down view an example via 116, which may include a hollow center portion 322. In other embodiments, the conductive material completely or substantially fills openings 320. Vias 116 may extend through core 114 and dielectric layer 112 to electrically connect to conductive features 104 of coreless build-up portion 316.

Contact pads 118 may also be formed over core 114. Contact pads 118 may be formed using a substantially similar process as contact pads 110. For example, a patterned photoresist (not shown) may be formed over core 114. Openings in the patterned photoresist may be used to define a shape of contact pads 118. Such openings may be filled with a conductive material, for example, by first depositing a seed layer (not shown) on bottom surfaces and/or sidewalls of such openings and filling the openings using an electro-chemical plating process. Contact pads 118 may be electrically connected to contacts 104 by vias 116, and in contact pads 118 may be used to bond other packages (e.g., package 204 of FIG. 7A) to substrate 150.

Next, in FIG. 8L, solder resists 122A and 122B are formed on package substrate 150. Solder resist 122A may be disposed over core 114 and solder resist 122B may be disposed on a bottom surface of coreless build-up portion 316. Solder resists 122A and 122B may be patterned to expose at least portions of contact pads 118 and 110, respectively. Solder resists 122A and 122B may comprise a heat-resistant coating material, and may aid in protecting the various layers of package substrate 150.

In FIG. 8M, a portion of core 114 over cavity 120 (labeled 114') is removed to expose conductive features 102 and expanding cavity 120. The removal of core portion 114' may be done using any suitable method, such as laser drilling, mechanical drilling, and the like. Process conditions (e.g., time of mechanical drilling, focus of laser drilling, and the like) may be controlled so that core portion 114' may be removed without damaging underlying features of package substrate 150. In some embodiments, a protective layer (e.g., comprising a metal, not shown) may be included under core portion 114' to protect underlying features during the removal of core portion 114'. After core portion 114' is removed, the protective layer may also be removed to expose conductive features 102. Thus, package substrate 150 having a coreless build-up portion 316 and a laminate portion 318 is formed. In subsequent process steps, a die 202 may be disposed on cavity 120 and bonded to conductive features 102 as illustrated by FIG. 8N. Additional features, such as those described in FIGS. 7A, 7B, and 9A through 11B, may then be formed around package substrate 150 and die 202.

Figure 9A:
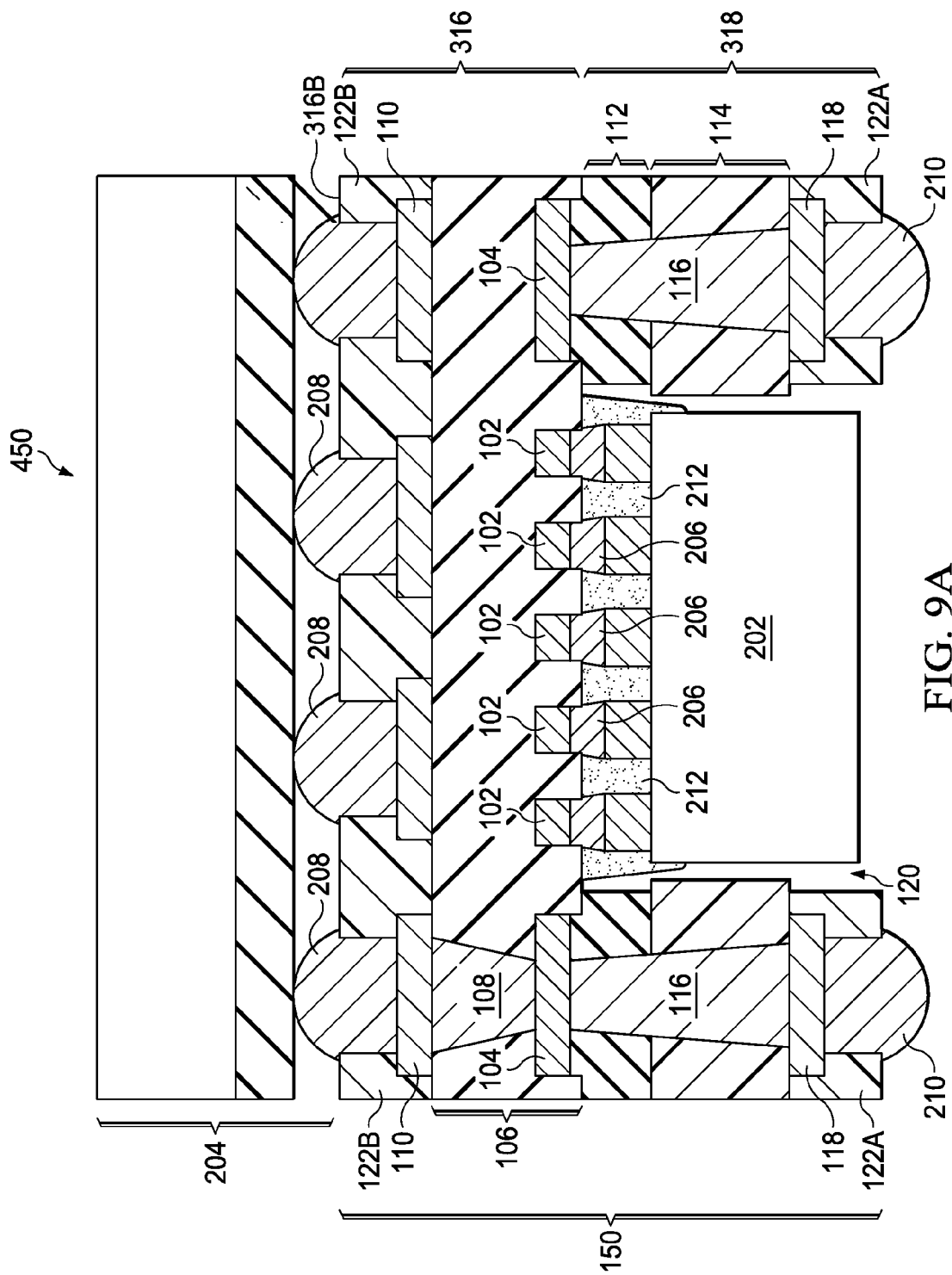
FIGS. 9A and 9B illustrate cross-sectional views of a device package incorporating a package substrate in accordance with some alternative embodiments.
Figure 9B:
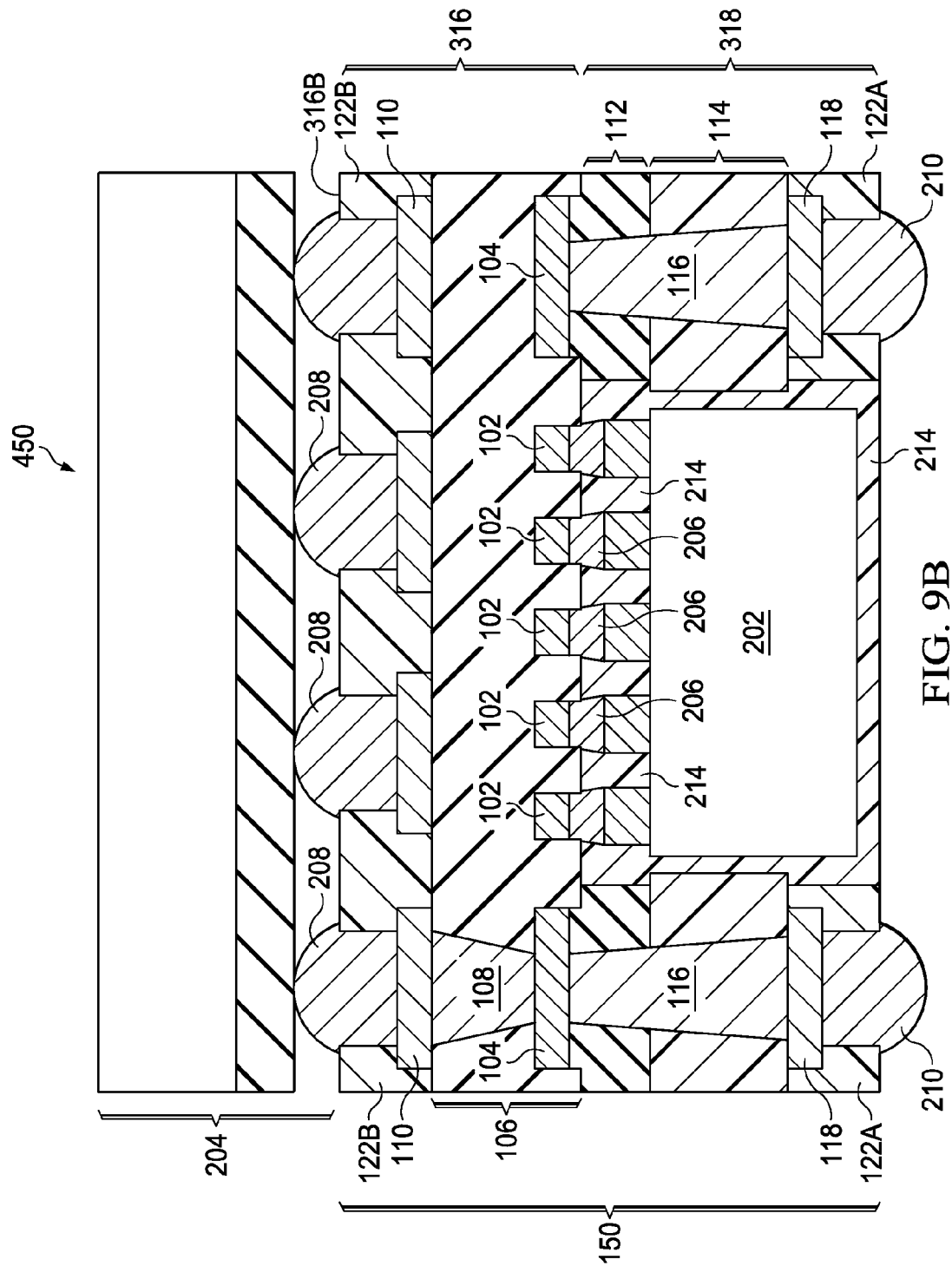

FIGS. 9A and 9B illustrate cross-sectional views of a package 450 having a package substrate 150 according to some alternative embodiments. Package 450 is similar to package 250 where like reference numerals indicate like elements. A die 202 may be disposed in cavity 120 and bonded to exposed conductive features 102 through connectors 206 In some embodiments (as illustrated by FIG. 9A), an underfill 212 may be dispensed around connectors 206. In other embodiments (as illustrated by FIG. 9B), a molding compound 214 may be dispensed around die 202 and at least partially fill cavity 120. Die 202 may be exposed by molding compound 214 (not shown) or molding compound 214 may cover die 202 (as illustrated by FIG. 9B).

Furthermore, in the alternative package configuration of FIGS. 9A and 9B, another device package 204 may be disposed on an opposing side of coreless build-up portion 316 as die 202. For example, device package 204 may be bonded to contact pads 110, not 118, by connectors 208. Because cavity 120 does not extend through coreless build-up portion 316, contact pads 110 may be disposed in a full grid array on bottom surface 316B (illustrated as a top surface in the orientation shown in FIGS. 9A and 9B) of coreless build-up portion 316. Thus, additional contacts may be provided for bonding package 204. In the illustrated embodiments, laminate portion 318 of package substrate 150 provides a sufficient standoff height so that die 202 may be disposed in cavity 120. External connectors 210 may be disposed on contact pads 118 on a same side of package substrate 150 as die 202. External connectors 210 may be used to bond package 450 to another package component such as an interposer, package substrate, printed circuit board, and the like.

Figure 10:
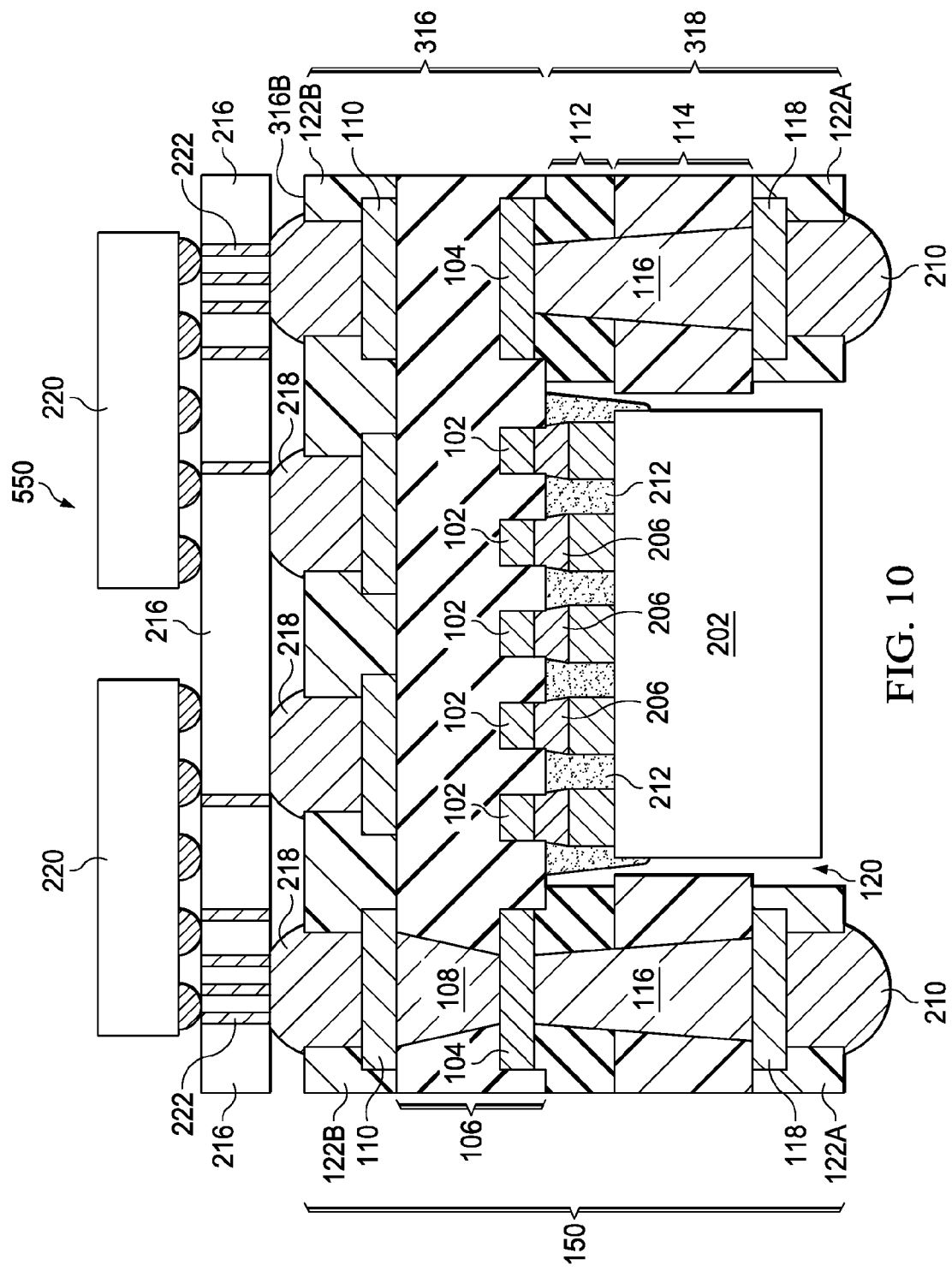
FIG. 10 illustrate cross-sectional views of a device package incorporating a package substrate in accordance with some alternative embodiments.

FIG. 10 illustrate a cross-sectional view of a package 550 having a package substrate 150 according to some alternative embodiments. Package 550 is similar to package 450 where like reference numerals indicate like elements. However, in package 550, an interposer 216 may be bonded to contact pads 110 by connectors 218 (e.g., BGA balls, C4 bumps, microbumps, or the like) instead of another device package 204. Interposer 216 may include conductive features, such as through-vias 222. Other package components (e.g., dies 220, another device package, and the like) may be bonded to interposer 216, and conductive features (e.g., through vias 222) in interposer 216 may electrically connect the other package components to package substrate 150.

Figure 11A:
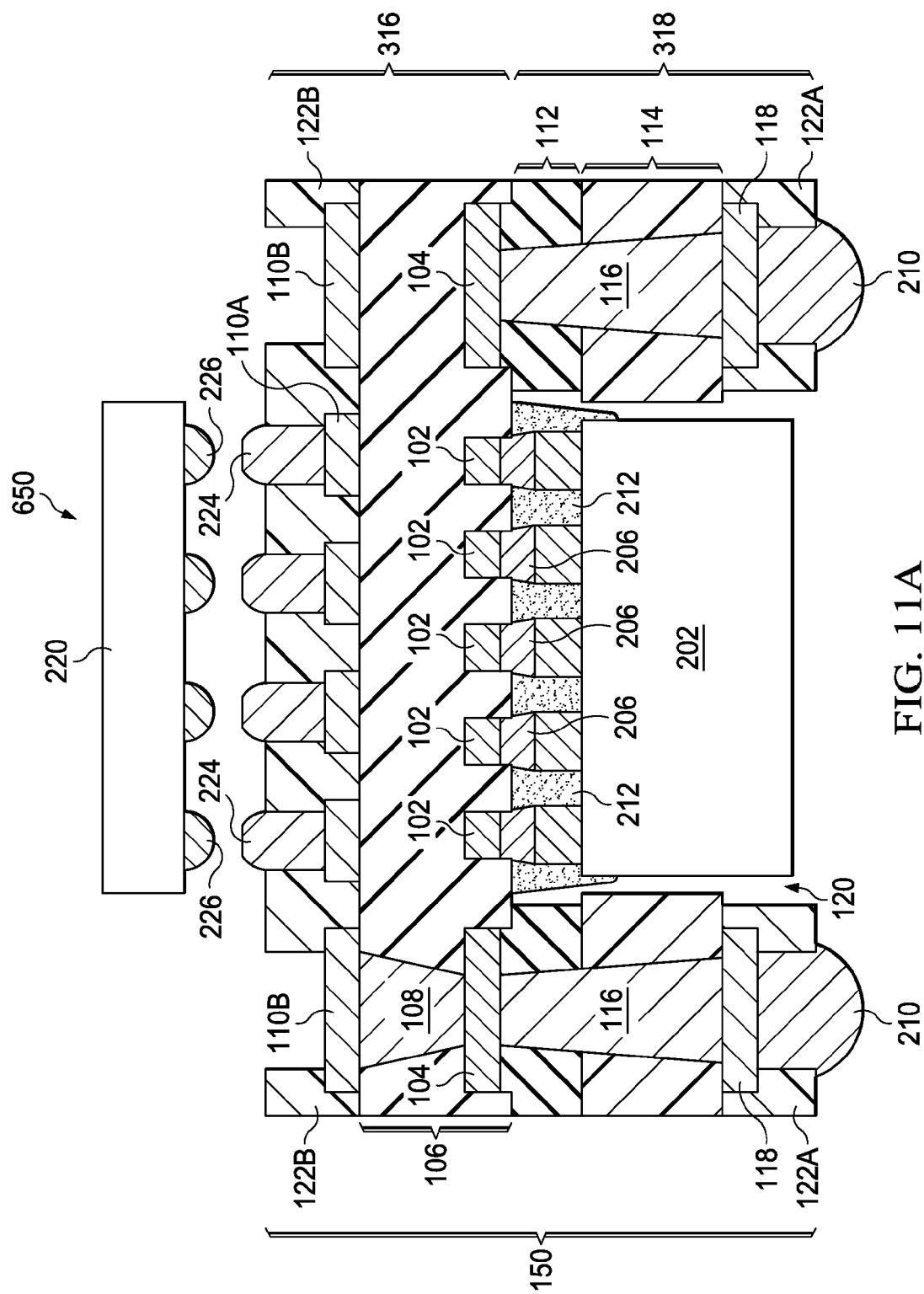
FIGS. 11A and 11B illustrate cross-sectional views of a device package incorporating a package substrate in accordance with some alternative embodiments.
Figure 11B:
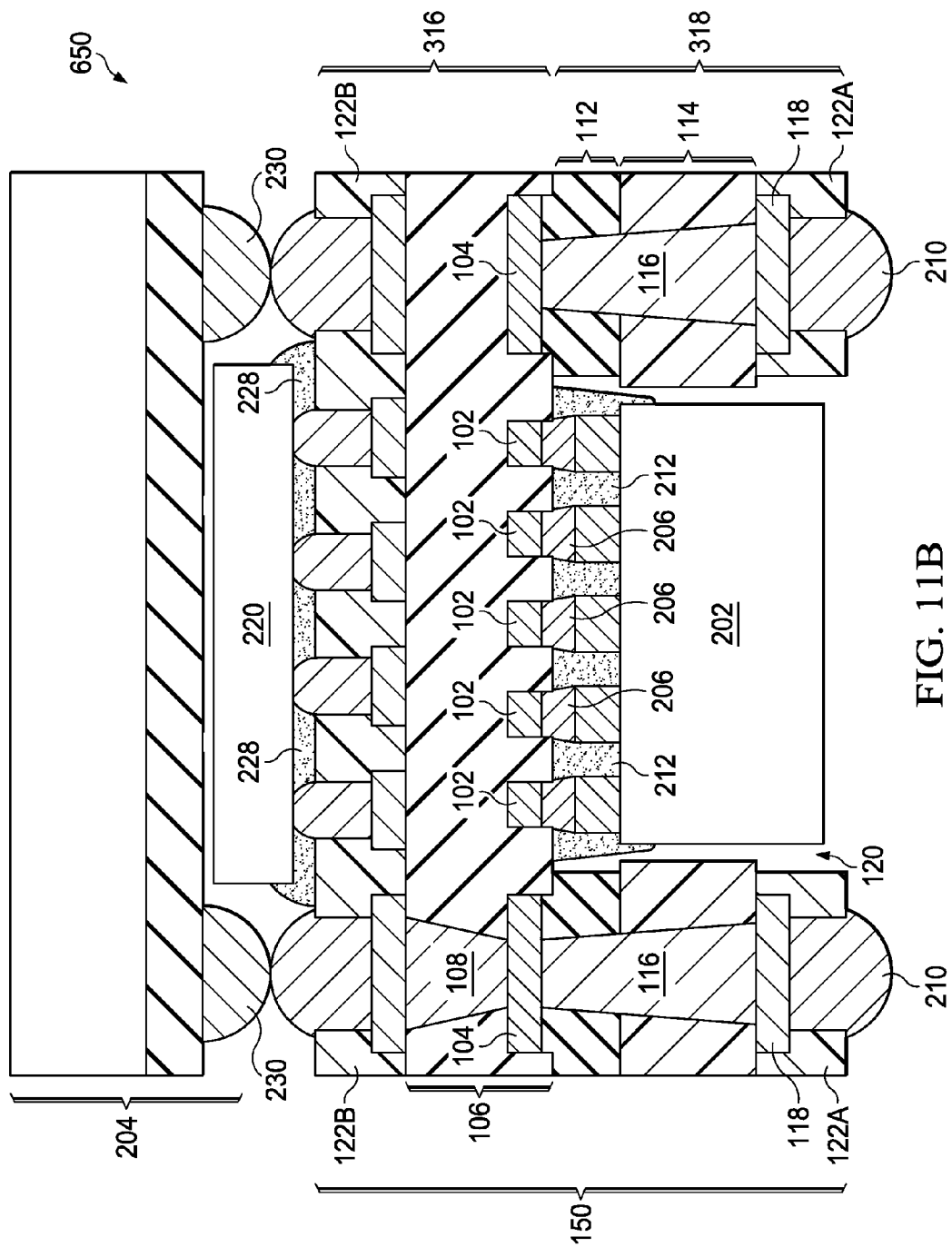

FIGS. 11A and 11B illustrate cross-sectional views of intermediary steps of manufacturing a package 650 having a package substrate 150 according to some alternative embodiments. Package 650 is similar to package 450 where like reference numerals indicate like elements. Referring first to FIG. 11A, presolder 224 may be disposed on a subset of contact pads 110 (labeled 110A). Other contact pads 110B may remain exposed. The presolder may be disposed in openings defined by solder resist 122B. Subsequently, presolder 224 may be used to bond another device die 220 to contact pads 110A. Contacts 226 (e.g., BGA balls, C4 bumps, microbumps, and the like) on die 220 may be bonded with presolder 224. Alternatively, presolder 224 may be omitted, and contacts 226 may be directly bonded on contacts pads 110A.

After die 220 is bonded, an underfill 228 may be dispensed between die 220 and package substrate 150 as illustrated by FIG. 11B. As further illustrated by FIG. 11B, another package component (e.g., package 204) may be bonded to contact pads 110B by solder balls 230. In some embodiments, the bonding of package 204 may include first forming a presolder on contact pads 110B. Solder balls 230 may be sufficiently large to provide a sufficient standoff height so that die 220 may be disposed between package 204 and package substrate 150.

Figure 12:
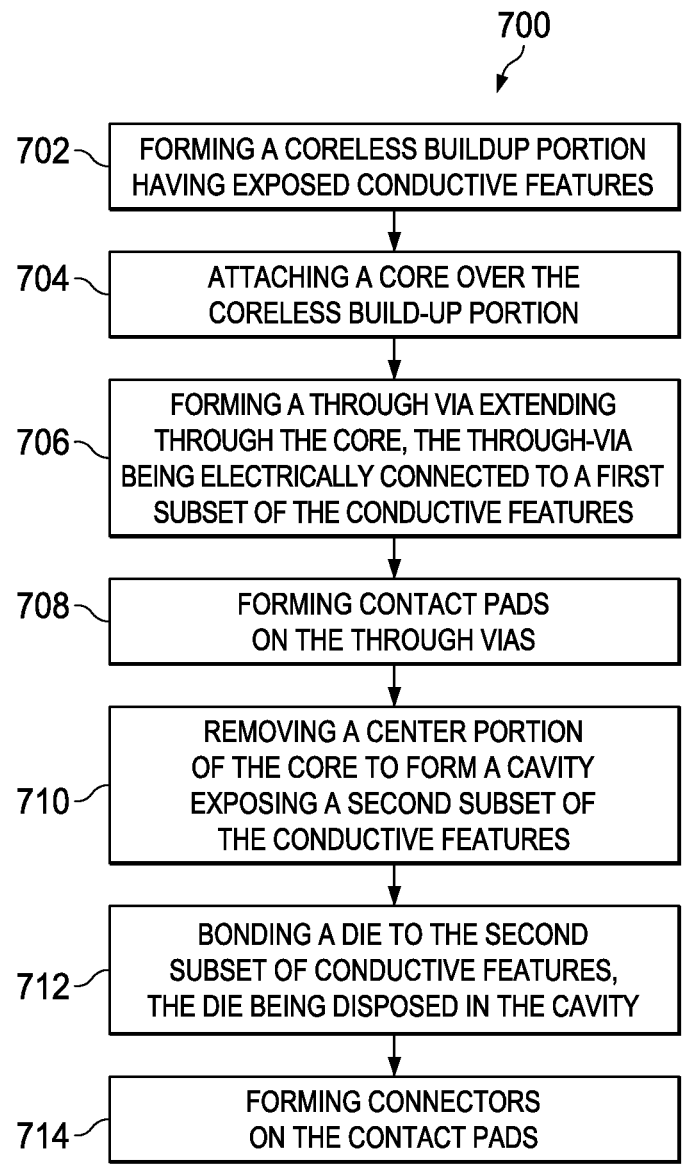
FIG. 12 illustrates a process flow for forming a package in accordance with some alternative embodiments.

FIG. 12 illustrates a process flow 700 for forming a package (e.g., package 250, 450, 550, or 650) in accordance with some embodiments. In step 702, a coreless build-up portion (e.g., coreless build-up portion 316) is formed having exposed conductive features (e.g., bump pads 102 and contact pads 104). The formation of the coreless build-up portion may be in accordance with the steps illustrated by FIGS. 8A through 8G. For example, various build-up layers having conductive features may be formed on a temporary core, which provides structural support. The build-up layers may then be separated from the core (e.g., using mechanical force). A seed layer may then be removed to expose conductive features (e.g., features 102 and 104) in the build-up layers.

Next, in step 704, a core (e.g., core 114) is attached to the coreless build-up portion. In some embodiments, the core is attached using a dielectric layer (e.g., dielectric layer 112), which may be patterned to include a cavity (e.g., cavity 120). In step 706, through vias (e.g., vias 116) are formed extending through the core. The through vias may be electrically connected to a first subset of the conductive features (e.g., contact pads 104). Contact pads (e.g., contact pads 118) may be formed on the through vias in step 708.

In step 710, a center portion (e.g., portion 116') of the core is removed to form a cavity 120. The cavity may be defined by remaining portions of the core, which may encircle the cavity. A second subset of the conductive features (e.g., bump pads 102) may be exposed by cavity 120. Thus, a package substrate (e.g., substrate 150) is formed in accordance with some embodiments. Subsequently, in step 712, a die (e.g., die 202) may be bonded to the second subset of the conductive features (e.g., bump pads 102). The die may be disposed in the cavity. In step 714, connectors may be formed on the contact pads on the through vias. In some embodiments, the other package component (e.g., package 204) may be bonded to the contact pads on the through vias. In other embodiments, another package component (e.g., package 204, interposer 216, die 220, and the like) may be bonded to contact pads formed on an opposing side of the coreless build-up portion as the cavity.

Thus, as described above, a package substrate may include a cavity. A first die may be bonded to the package substrate. Where the cavity may be on the same side of the package substrate as the first die or on an opposing side of the package substrate as the first die. One or more second dies may be bonded to the package substrate and the first die, and the second dies may be disposed in the cavity. The second die may be bonded directly to the first die, or the second die may be bonded directly to the package substrate. Thus, the configuration of the package substrate allows for a package having a relatively thin form factor. Furthermore, the configuration of the dies in the package may allow for relatively simplistic heat dissipation elements to be attached to at least the first die.

In accordance with an embodiment, a device package includes a package substrate and a first and a second die bonded to the package substrate. The package substrate includes a build-up portion comprising a first contact pad and a plurality of bump pads. The package substrate further includes an organic core attached to the build-up portion, a through-via electrically connected to the first contact pad and extending through the organic core, a second contact pad on the through-via, a connector on the second contact pad, and a cavity extending through the organic core. The cavity exposes the plurality of bump pads, and the first die is disposed on the cavity and is bonded to the plurality of bump pads.

In accordance with another embodiment, a method for forming a device package includes providing a package substrate and bonding a first and a second die to the package substrate. The package substrate includes a build-up portion having a plurality of bump pads, an organic core attached to the build-up portion, a through-via extending through the organic core, and a cavity extending through the organic core. The through-via is electrically connected to a conductive feature in the build-up portion, and, and the plurality of bump pads are exposed by the cavity. Bonding the first die includes bonding the first die to the plurality of bump pads, wherein the first die is at least partially disposed in the cavity.

In accordance with yet another embodiment, a method for forming a device package includes forming a build-up portion having a first contact pad and a plurality of bump pads. The method further includes attaching an organic core to the build-up portion, patterning an opening extending through the organic core, exposing the first contact, forming a through-via in the opening and contacting the first contact pad, forming a second contact pad on the through-via, and forming a connector on the second contact pad. Subsequently, a portion of the organic core is removed to form a cavity extending through remaining portions of the organic core. The cavity exposes the plurality of bump pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
a first package substrate comprising:
 a build-up portion comprising a first contact pad and a plurality of bump pads in a first surface of the build-up portion;
 a dielectric layer attached to the first surface of the build-up portion;
 an organic core attached to the dielectric layer, the organic core being a different material composition than the build-up portion;
 a through-via extending through the organic core, wherein the through-via is electrically connected to the first contact pad;
 a second contact pad on the through-via;
 a connector on the second contact pad;
 a solder resist disposed around the connector; and
 a cavity extending through the organic core, the solder resist, and the dielectric layer, wherein the cavity exposes the plurality of bump pads;
a first die disposed in the cavity, wherein the first die is bonded to the plurality of bump pads;
an underfill dispensed in the cavity between the first die and the build-up portion, the underfill being different from the dielectric layer; and
a second die bonded to the first package substrate.

2. The device package of claim 1, wherein the first package substrate further comprises a third contact pad at an opposing surface of the build-up portion as the first surface, and wherein the second die is disposed on a second device package bonded to the third contact pad.

3. The device package of claim 1, further comprising a third device package bonded to the first package substrate, wherein the second die is disposed between the third device package and the first package substrate.

4. The device package of claim 1, wherein the build-up portion is a coreless build-up portion.

5. A method for forming a device package comprising:
forming a build-up portion, the build-up portion comprising one or more first dielectric layers, a plurality of bump pads in a first side of the first dielectric layers, and a conductive feature in the first side of the first dielectric layers;
forming a laminate portion comprising:
 attaching an organic core to the build-up portion with a second dielectric layer, the organic core being a different material composition than the build-up portion;
 forming a through-via extending through the organic core and the second dielectric layer, wherein the through-via is electrically connected to the conductive feature in the build-up portion;
 disposing a solder resist on the organic core, the solder resist having a first side and a second side opposite the first side, the first side of the solder resist facing the build-up portion; and
 forming a cavity extending through the organic core, the solder resist, and the second dielectric layer, wherein the plurality of bump pads are exposed by the cavity, wherein the cavity has a first height extending from the first side of the first dielectric layers to the second side of the solder resist;
bonding a first die to the plurality of bump pads, the first die having a first surface and a second surface opposite the first surface, the first surface of the first die facing the build-up portion, wherein the first die is disposed in the cavity, wherein the first die has a second height extending from the first side of the first dielectric layers to the second surface of the first die, the second height less than the first height; and bonding a second die to the build-up portion.

6. The method of claim 5, wherein bonding the second die comprises:
  providing a second device package comprising the second die; and
  bonding the second device package to the build-up portion.

7. The method of claim 6, wherein bonding the second device package comprises bonding the second device package to an opposing side of the build-up portion as the first die.

8. The method of claim 5, wherein the one or more first dielectric layers are substantially free of an organic material.

9. A method for forming a device package comprising:
  forming a build-up portion comprising a first contact pad and a plurality of bump pads;
  patterning a first dielectric on the build-up portion, the first dielectric covering the first contact pad, the first dielectric including a cavity exposing the plurality of bump pads;
  attaching an organic core to the first dielectric;
  patterning an opening extending through the first dielectric and the organic core, the opening exposing the first contact pad;
  forming a through-via in the opening, the through via contacting the first contact pad;
  forming a second contact pad on the through-via;
  forming a connector on the second contact pad; and
  removing a portion of the organic core to expand the cavity through remaining portions of the organic core.

10. The method of claim 9, wherein forming the build-up portion comprises:
  providing carrier having a seed layer disposed on a surface of the carrier;
  forming the first contact pad and the plurality of bump pads on the seed layer;
  forming a second dielectric layer on the first contact pad, the plurality of bump pads, and the seed layer;
  removing the carrier; and
  removing the seed layer to expose the first contact pad and the plurality of bump pads.

11. The method of claim 10, wherein removing the seed layer comprises an etching process.

12. The method of claim 10, wherein forming build-up portion comprises simultaneously forming a second build-up portion on an opposing side of the carrier as the build-up portion.

13. The method of claim 9, wherein attaching the organic core comprises:
  disposing an uncured dielectric layer over the build-up portion, wherein the uncured dielectric layer is patterned to expose the plurality of bump pads;
  disposing the organic core over the uncured dielectric layer; and
  performing a curing process to adhere the organic core to the build-up portion.

14. The method of claim 9, further comprising bonding a die to the plurality of bump pads, wherein the die is disposed in the cavity.

15. The device package of claim 1, wherein the through-via extends through the dielectric layer.

16. The device package of claim 1, wherein the first die has a first surface and a second surface opposite the first surface, the first die having connectors on the first surface, the first die bonded to the plurality of bump pads with the connectors, the second surface exposed by the cavity.

17. The device package of claim 1, wherein the through-via includes a hollow center portion.

* * * * *